United States Patent [19]
Kubota

[11] Patent Number: 5,633,599
[45] Date of Patent: May 27, 1997

[54] SEMICONDUCTOR INTEGRATED CIRCUIT WITH A TEST CIRCUIT FOR INPUT BUFFER THRESHOLD

[75] Inventor: Shuji Kubota, Kanagawa, Japan

[73] Assignee: NEC Corporation, Tokyo, Japan

[21] Appl. No.: 509,616

[22] Filed: Jul. 31, 1995

[30] Foreign Application Priority Data

Jul. 29, 1994 [JP] Japan ................. 6-177868

[51] Int. Cl.$^6$ ............................ H03K 19/003
[52] U.S. Cl. ................ 326/16; 326/21; 371/22.6
[58] Field of Search .............. 326/16, 21; 371/22.6, 371/25.1

[56] References Cited

U.S. PATENT DOCUMENTS

| Re. 34,916 | 4/1995 | Sweeney | 326/16 |
|---|---|---|---|
| 5,077,521 | 12/1991 | Langford, II et al. | 371/25.1 X |
| 5,369,645 | 11/1994 | Pritchard et al. | 371/22.1 |
| 5,371,712 | 12/1994 | Oguchi et al. | 365/201 X |
| 5,392,298 | 2/1995 | Shinjo | 371/25.1 |
| 5,495,487 | 2/1996 | Whetsel, Jr. | 371/25.1 |

FOREIGN PATENT DOCUMENTS

| 27580 | 1/1990 | Japan . |
|---|---|---|
| 2291164 | 11/1990 | Japan . |
| 3214079 | 9/1991 | Japan . |
| 4194677 | 7/1992 | Japan . |
| 4359175 | 12/1992 | Japan . |

*Primary Examiner*—David R. Hudspeth
*Attorney, Agent, or Firm*—Sughrue, Mion, Zinn, Macpeak & Seas

[57] ABSTRACT

In a semiconductor integrated circuit provided with a circuit for testing an input buffer threshold voltage, an output node of a first logic gate having its output logic value determined by an output signal of an input buffer, and an output node of a second logic gate having its output logic value determined by a condition setting signal from an external source, are connected to a common signal line. When a standardized voltage for discriminating the threshold voltage is applied to the input buffer, if the input buffer malfunctions, the output signal of the first logic gate collides with the output signal of the second logic gate on the common signal line, so that a power supply current greatly increases.

8 Claims, 17 Drawing Sheets

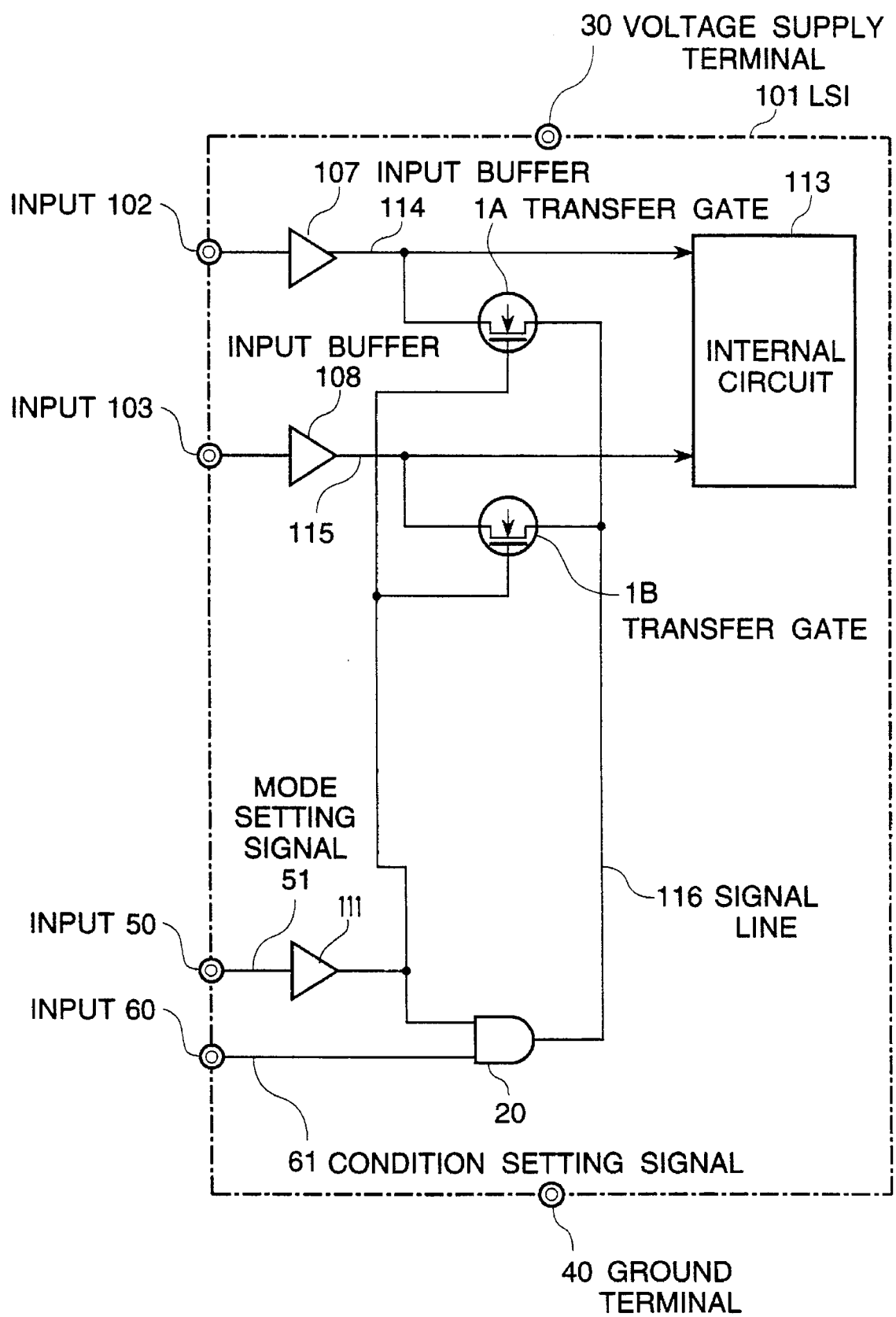

and a control circuit 804 accessing the ROM 802.

SEMICONDUCTOR INTEGRATED CIRCUIT WITH A TEST CIRCUIT FOR INPUT BUFFER THRESHOLD

BACKGROUND OF THE INVENTION

1. Field of the Invention

The present invention relates to a digital semiconductor integrated circuit of a CMOS (complementary metal oxide semiconductor field effect transistor) structure, and more specifically to a semiconductor integrated circuit provided with a test circuit for checking whether or not a threshold voltage of an input buffer is within a predetermined range.

2. Description of Related Art

Ordinarily, a semiconductor integrated circuit (called an "LSI" hereinafter) is so configured that a plurality of digital data signals and control signals are simultaneously received, and a predetermined signal processing is performed by an internal logic circuit (called an "internal circuit" simply hereinafter). In this case, before a signal supplied to each of external terminals for receiving a signal (input terminals) is applied to the internal circuit, each input signal is current-amplified by an input buffer to have a sufficient driving power, and thereafter, the input signal is actually applied to the internal circuit. Therefore, in order to cause the LSI to execute an expected signal processing, each input buffer is required to transfer a logic value of the input signal to the internal circuit without error. As one requirement for fulfilling this request, it is very important that a threshold voltage of the input buffer is in a predetermined range.

In a conventional test for the threshold of the input buffer in the LSI, a test signal is applied to an input terminal (an input point of the input buffer) so as to perform a function test of the LSI. If the LSI operates normally, namely, if an expected output signal is obtained from an external output terminal of the LSI, it is discriminated that the threshold voltage of the input buffer meets with the standard value. In this case, however, depending upon a combination of input signals applied to a plurality of input buffers, it is in some cases that a signal applied to an input buffer to be tested is used only for the signal processing in the internal circuit, and the change of the input signal is not externally outputted as any change of a signal outputted from an output terminal. In this case, the input threshold of the input buffer in question cannot be tested. Therefore, in order to surely test the threshold of the input buffer in question, it was necessary to repeat the function test while variously changing a combination of the input signals applied to a plurality of input terminals. Recently, with a remarkable advance of the integration density and the multi-function of the LSI, the number of the input terminals has increased, and therefore, a function test pattern for testing the input threshold voltage of all input buffers becomes very complicated and large and long. Therefore, the number of steps for preparing and actually performing the function test pattern has increased, and this increased number of steps has become a large problem.

Under this circumstance, the prior art has proposed various methods and apparatuses for efficiently performing the input threshold voltage. Japanese Patent Application Pre-Examination Publication JP-A-3-214079 proposes one approach (called a "first prior art" hereinafter). Referring to FIG. 1A, there is shown a block diagram of the input threshold voltage measuring apparatus shown in JP-A-3-214079. FIG. 1B illustrates an operation waveform at the time of the measurement.

In the input threshold voltage measuring apparatus shown in FIG. 1A, a sweep voltage generating circuit 801 generates an analog sweep voltage waveform "s" shown in an upper part of FIG. 1B. This voltage waveform "s" is a truncated conical shape having two ramp voltages, which, with lapse of a time, firstly elevates constantly at a predetermined rate, and then, becomes flat, and finally, drops constantly at a predetermined rate. This sweep voltage generating circuit 801 is constituted of a ROM 802, a D/A converter 803, and a control circuit 804 accessing the ROM 802.

In the ROM 802, digital data to be converted into an analog voltage at each moment in order to generate the analog sweep voltage waveform "s" is stored in a sequential address in order.

The control circuit 804 is composed of a clock generator and a program counter (both not shown) for generating an address used to access the ROM 802, so that the ROM 802 is accessed in accordance with the address generated. The access address is sequentially incremented in response to the clock. Thus, the digital data to be converted into an analog value is read out from respective addresses of the ROM, with lapse of time in units of a clock period, so that the read-out digital data is supplied to the D/A converter 803. As a result, the analog sweep voltage waveform "s" is outputted from the D/A converter 803.

In addition, if the control circuit 804 receives a sweep stop signal from a peak current detecting circuit 808 explained hereinafter, the control circuit stops the increment of the address counter in response to the clock generated by the clock generator. In this condition, the address in a stopped position of the ROM 802 is repeatedly continuously accessed in response to the clock, so that the digital data at the stopped address is continuously supplied to the D/A converter 803. Thus, the analog voltage generated at the moment the sweep stop signal is received, continues to be outputted from the sweep voltage generating circuit 801.

The analog voltage thus generated by the sweep voltage generating circuit 801 is applied through a switch circuit 805 to one of input terminals IN of an integrated circuit 806, namely, a device under test (abbreviated "DUT" hereinafter). The switch circuit 805 is a change-over switch controlled by a switch change signal from the peak current detecting circuit 808, so as to switch the output voltage of the sweep voltage generating circuit 801 from the DUT 806 to a voltage measuring circuit 807.

The peak current detecting circuit 808 is a current level detecting circuit composed of a comparator, and operates to generate a detection signal when a current IDD flowing from a power supply circuit 809 to a power supply terminal VDD of the DUT 806 exceeds a predetermined reference level ITH (See FIG. 1B). This detection signal is supplied as the sweep stop signal D to the sweep voltage generating circuit 801, and also as the switch change signal to the switch circuit 805. In addition, the detection signal D is supplied as a peak detection signal to a measurement control circuit 810.

The measurement control circuit 810 supplies a start signal to the sweep voltage generating circuit 801, and receives and processes a measured voltage value obtained in the voltage measuring circuit 807. Thus, it is a control circuit for the whole of the input threshold voltage measuring apparatus.

Now, operation of the first prior art having the above mentioned construction will be described with reference to FIG. 1B.

First, the measurement control circuit 810 outputs the start signal to the sweep voltage generating circuit 801. In response to the start signal, the sweep voltage generating circuit 801 generates the analog sweep voltage waveform "s" shown in FIG. 1B, so that the input voltage Vin of the DUT 806 linearly elevates with a lapse of time. When the analog voltage "s" exceeds an input threshold voltage of the input buffer of the DUT 806, the internal circuit receiving this input signal is put in an operating condition. At this time, depending upon the operation of the internal circuit, a transient current flows as an operating current for example in a CMOSIC. This operation current $I_{DD}$ is measured as a characteristics current curve "p" having a peak shown in FIG. 1B.

This current value $I_{DD}$ is monitored by the peak current detecting circuit 808. The moment the current value $I_{DD}$ exceeds the reference current value $I_{TH}$, corresponds to the moment an inverter (constituting the input buffer in the DUT 806) flips. Therefore, this means that the voltage waveform "s" exceeds the input threshold voltage. In the shown example, the peak current detecting circuit 808 generates the peak current detecting signal at a time T901. The sweep voltage generating circuit 801 receiving the detecting signal as the sweep stop signal D, stops the sweep operation, and at the same time, the switch circuit 805 is switched over so that the analog voltage generated by the sweep voltage generating circuit 801 at that time is measured through the switch circuit 805 by the voltage measuring circuit 807. The result of the measurement is fetched into the measurement control circuit 810 receiving the peak the detecting signal D.

At this time, the measurement control circuit 810 supplies a control signal to the sweep voltage generating circuit 801 so as to cancel the clock stop signal. As a result, after the sweep voltage has become a constant value, the sweep voltage starts to drop.

In the course of the drop of the sweep voltage, when the value of the voltage waveform "s" becomes lower than the input threshold voltage of the DUT 806, a peak current appears again in the current $I_{DD}$. With this, it is possible to measure a low level $V_{IL}$ of the input threshold voltage.

Incidentally, this first prior art is so configured that the reference value $I_{TH}$ used as the comparison reference in the peak current detecting circuit 808 can be adjusted externally so as to be changed in accordance with the characteristics of the DUT 806.

Next, another example of the conventional input threshold voltage testing method disclosed in Japanese Patent Application Pre-Examination Publication JP-A-4-194667 (called a "second prior art" hereinafter).will be described with reference to FIG. 2A.

Referring to FIG. 2A, an input circuit 1021 of a Bi-CMOS LSI is supplied with a supply voltage $V_{DD}$ through an ammeter 1023, and an input voltage Vin is applied to an input terminal 1020 from a DC voltage supply 1022.

Here, when the input voltage Vin is for example at a low level, a pnp transistor 1006 is in an on condition, and therefore, a p-channel MOS (pMOS) transistor 1007 is also in an on condition and an n-channel MOS (nMOS) transistor 1008 is in an off condition, so that an output voltage at a terminal 1024 is at a high level. Thereafter, if the input voltage Vin is caused to gradually elevate as shown in FIG. 2B, the pnp transistor 1006 is brought to an off condition from the on condition. At this time, before the pMOS transistor 1006 is completely turned off, the nMOS transistor 1008 is turned on, so that a passthrough current flows from the voltage supply terminal $V_{DD}$ to a ground terminal GND as shown in FIG. 2C. Thereafter, the pMOS transistor 1007 is turned off, and the nMOS transistor 1008 is turn on, so that the output voltage on the terminal 1024 is brought to a low level.

Thus, the input voltage Vin when the ammeter 1023 detects the above mentioned passthrough current, corresponds to the threshold voltage Vth. Accordingly, the input threshold voltage is measured by detecting the passthrough current which flows in the input circuit operation when the input voltage Vin is gradually changed.

Now, a third example of the conventional input threshold voltage testing method will be described on the basis of the disclosure of in Japanese Utility Model Application Pre-Examination Publication JP-UA-2-007580 (called a "third prior art" hereinafter).

Referring to FIG. 3A, there is shown an apparatus for discriminating a non-defective/defective of a DUT incorporating a plurality of electronic circuits therein, on the basis of an input threshold voltage. This apparatus includes an input voltage generator 1214 for supplying an input voltage into each of input circuits 1212 of the DUT 1210, a passthrough current detecting circuit 1215 for detecting a passthrough current which instantaneously flows in the input circuits when an output level of each input circuit 1212 changes in response to the input voltage, and a threshold voltage discriminator 1222 for discriminating on the basis of the passthrough current, whether or not the threshold voltage of the input voltage is in a standardized range.

As shown in FIG. 3B, the input voltage generator 1214 receives a test start signal 1213 and gradually elevates the input voltage Vin from a low level to a high level. In this process, when the input voltage Vin exceeds the input threshold of the input circuit 1212 internally provided in the DUT 1210, the output voltage Vout of the input circuit 1212 is brought from a low level to a high level. At this time, a passthrough current as mentioned hereinbefore is detected by the passthrough current detecting circuit 1215, which outputs a passthrough current detecting signal 1211 to the threshold voltage discriminator 1222. This threshold voltage discriminator 1222 receives the passthrough current detecting signal 1211, and discriminates whether or not the threshold voltage of the input voltage is in the standardized range. Namely, the threshold voltage discriminator 1222 outputs the result of the discrimination. Thus, the input threshold voltage test is performed.

All of the first, second and third prior arts explained above are so configured to measure the input threshold voltage of the input circuit by detecting the increase of the power supply current (generation of the passthrough current in the input circuit) when the input voltage exceeds the threshold voltage of the input buffer and the circuit including the input buffer changes its condition. Differently from the above mentioned prior arts, another approach is to set, a mode generally called a test mode, different from a mode in which inherent signal processing is performed in which a threshold voltage of the input buffer is tested and measured by using an input voltage testing circuit provided in the LSI. In the following, some of this type approach will be described.

Now, as a fourth example of the conventional input threshold voltage testing approach, a construction of the LSI disclosed in Japanese Patent Application Pre-Examination Publication JP-A-4-359175 (called a "fourth prior art" hereinafter).will be described with reference to FIGS. 4A and 4B.

Referring to FIG. 4A, there is shown a block diagram of the LSI incorporating therein a circuit for measuring the input threshold voltage of the input buffer and for outputting the result of the measurement. As shown in FIG. 4A, an input signal applied to an input terminal 1408 is supplied to an input buffer 1402. An output signal of the input buffer 1402 is supplied to an internal circuit 1401 where various electric circuits are caused to operate. At the same time, the output signal of the input buffer 1402 is supplied to a selector 1404 as one signal to be selected.

The selector 1404 receives, as another signal to be selected, an output signal 1406 from the internal circuit 1401, and is controlled by a selector selection signal 1407 generated in the internal circuit 1401, so as to select and output one of the two "signals to be selected" supplied to the selector 1404. The selected signal is supplied to an output buffer 1403, which in turn outputs the supplied signal through an output terminal 1409 to an external of the LSI.

When the input threshold value is tested, the selector selection signal 1407 controls the selector 1404 to select the signal 1405 to be selected and to output it to the output buffer 1403. In a normal signal processing operation, the selector selection signal 1407 controls the selector 1404 to select the signal 1406 to be selected so that information is transferred from the internal circuit 1401 to the output buffer 1403.

When the input threshold voltage test is executed, a standardized voltage $V_{IH}$ of a high level input threshold voltage is applied to the input terminal 1408, as shown in an upper column of FIG. 4B. This input signal causes the input buffer 1402 to operate, so that the output signal 1405 of the input buffer is selected by the selector 1404 to be transferred to the output buffer 1403. If the input threshold voltage of the input buffer 1402 meets with the above mentioned standardized voltage $V_{IH}$ of the high level input threshold voltage, an output signal in the same phase as that of the input signal appears on the output terminal 1409, as shown in a middle column of FIG. 4B. However, when the input threshold voltage of the input buffer 1402 does not meet with the standardized voltage, namely, when the input buffer 1402 malfunctions, an output signal in a phase opposite to that of the input signal appears on the output terminal 1409, as shown in a lower column of FIG. 4B. In this manner, whether or not the input threshold voltage fulfills the standard, can be discriminated on the basis of whether the input signal and the output signal are in the same phase or in the opposite phase.

Next, as a fifth example of the conventional input threshold voltage testing approach, a construction of the LSI disclosed in Japanese Patent Application Pre-Examination Publication JP-A-2-291164 (called a "fifth prior art" hereinafter).will be described with reference to FIGS. 5A and 5B.

Referring to FIG. 5A, an input node of an input buffer 1604 is connected to an input terminal 1601, and an input node of input buffers 1605 and 1606 are connected to input terminals 1602 and 1603, respectively.

An output node of the input buffer 1604 is connected to an internal circuit 1610 and one input "A" of a two-input NAND gate 1607, which in turn has the other input "B" connected to a voltage supply terminal $V_{DD}$. An output node of the input buffer 1605 is connected to the internal circuit 1610 and one input "A" of another two-input NAND gate 1608, which in turn has the other input "B" connected to an output of the NAND gate 1607. An output node of the input buffer 1606 is connected to the internal circuit 1610 and one input "A" of a further two-input NAND gate 1609, which in turn has the other input "B" connected to an output of the NAND gate 1608. An output of the NAND gate 1609 is connected to an external output terminal 1617.

Now, an input threshold voltage testing method in this LSI will be described with reference to a timing chart shown in FIG. 5B. The input threshold of the input buffer 1604 is tested during a period $T_{171}$ in FIG. 5B. During this period, the input terminals 1602 and 1603 are fixed to a high level (supply voltage), and the input level of the input terminal 1601 is brought to a standardized voltage $V_{IH}$ of a high level threshold voltage. At this time, if the input buffer 1604 operates normally, the output signal 1611 of the input buffer 1604 becomes a high level, and therefore, the output of the NAND gate 1607 becomes a low level. Here, since the input terminals 1602 and 1603 are at the high level, both the output signal 1612 of the input buffer 1605 and the output signal 1613 of the input buffer 1606 are at the high level. Therefore, the NAND gates 1607, 1608 and 1609 become equivalent to an inverter chain receiving the signal 1611 as an input signal and for outputting a signal 1616 as an output signal.

In the shown example, since the three input terminals are provided, the output signal 1616 is in a phase opposite to that of the input terminal 1601, and the output terminal 1617 outputs a low level signal as shown in a fourth row of FIG. 5B. Similarly, when the input level of the input terminal 1601 is brought to a standardized voltage $V_{IL}$ of a low level threshold voltage, if the input buffer 1604 operates normally, the output terminal 1617 outputs a high level signal as shown in the fourth row of FIG. 5B.

On the contrary, if the input buffer 1604 malfunctions, the signal 1611 becomes in a phase opposite to that of the input level, and therefore, the output terminal 1617 outputs a signal having the same phase as that of the input level, as shown in a fifth row of FIG. 5B.

Next, during a period $T_{172}$ in FIG. 5B, the input threshold of the input buffer 1605 is tested. At this time, the input terminal 1603 is maintained at the high level, but the input terminal 1601 is maintained at the low level. By setting the input terminals as mentioned above, the output 1611 of the input buffer 1604 becomes the low level, so that the output 1614 of the NAND gate 1607 becomes the high level. Thus, the NAND gates 1608 and 1609 becomes equivalent to an inverter chain of two stages receiving the signal 1612 as an input signal and for outputting the signal 1616 as an output signal.

Therefore, if the input buffer 1605 operates normally, a signal appearing on the output terminal 1617 is in the same phase as that of the input signal applied to the input terminal 1602. On the contrary, if the input buffer 1605 malfunctions, the signal appearing on the output terminal 1617 is in a phase opposite to that of the input level applied to the input terminal 1602.

Next, during a period $T_{173}$ in FIG. 5B, the input threshold of the input buffer 1606 is tested. At this time, the input terminal 1602 is maintained at the low level, but the input terminal 1603 may be at the low level or at the high level. By setting the input terminals as mentioned above, the output 1612 of the input buffer 1605 becomes the low level, so that the output 1615 of the NAND gate 1608 becomes the high level. Thus, the NAND gate 1609 becomes equivalent to an inverter receiving the signal 1613 as an input signal and for outputting the signal 1616 as an output signal.

Therefore, if the input buffer 1606 operates normally, the signal appearing on the output terminal 1617 is in a phase opposite to that of the input signal applied to the input terminal 1603. On the contrary, if the input buffer 1605 malfunctions, the signal appearing on the output terminal 1617 is in the same phase as that of the input signal applied to the input terminal 1602.

Thus, it is possible to discriminate whether or not each of the input buffer operates normally, on the basis of whether the output signal is in the same phase as that of the input signal or in the opposite phase to that of the input signal.

In the conventional examples mentioned above, the input threshold voltage test methods of the first to third prior arts are configured to applying a ramp voltage to the input node of the input buffer and to detect the passthrough current flow when the ramp voltage exceeds the threshold of the input buffer, as an increase of the power supply current. However, when these methods are applied to the testing of an LSI having a plurality of input terminals, it is impossible to clearly define a reference current value used for discriminating the increase of the power supply current. Actually, there is no LSI having only one input terminal. Namely, if it is considered that actual LSIs have a number of input terminals, it can be said that the input threshold voltage test methods of the first to third prior arts cannot actually discriminate the non-defective/defective of the input threshold voltage of the LSIs. The reason for this is as follows:

Now, assume that, in accordance with the first to third prior arts, the input threshold voltage test is performed for input buffers of an LSI having two external input terminals A and B. Here, the two input buffers will be called an input buffer A and an input buffer B, respectively.

FIG. 6A illustrates an operation at the time of the measurement. In FIG. 6A, the axis of abscissas shows a time, and the axis of ordinates indicates an input voltage applied to the input terminals A and B. In addition, it is assumed that a high level input threshold voltage of the input buffer A is $V_A$, a high level input threshold voltage of the input buffer B is $V_B$, and a standardized value of the high level input threshold voltage is $V_H$. Therefore, the input buffer A fulfills the standardized value $V_H$, and on the other hand, the input buffer B does not fulfill the standardized value $V_H$. The voltage waveform "s" shows that the voltage applied to the input buffers A and B gradually elevates with the lapse of time. In FIG. 6B, on the other hand, the axis of abscissas shows a time with the same scale as that of the axis of abscissas of FIG. 6A, and the axis of ordinates indicates the power supply current of the LSI. The current value $I_{TH}$ is a reference current value used for the comparison in order to discriminate whether or not an increase of the power supply current occurs when the input voltage applied to each input terminal exceeds the input threshold of a corresponding input buffer.

Referring to FIGS. 6A and 6B, at a time $t_{18A}$, the input buffer B flips for the first time, so that an operation current flows, and therefore, the power supply current increases. In the first to third prior arts, the value of the power supply current at the time $t_{18A}$ must be compared with the reference current value. In other words, as the input threshold voltage, the input voltage at the time that the operation current is detected the voltage applied to the input terminals A and B gradually elevates. Because, during a period $t_{18E}$ after the first input buffer flips, an internal circuit receiving an output signal of the input buffer B and its succeeding circuits operate so that the power supply current further increases. Therefore, it is not possible to recognized that, in the change of the power supply current after the time $t_{18A}$, the power supply current at a time $t_{18B}$ is attributable to the operating current of the input buffer A which flips lastly since it have the highest input threshold. However, in the high level input threshold voltage testing, it is necessary to discriminate whether or not the input buffer having the highest input threshold fulfills the standardized value. Therefore, the test in accordance with the first to third prior arts cannot make a proper discrimination.

The above mentioned situation is not any special case. Rather, it can be said that there is no LSI having only one input terminal. Therefore, it must be said that the first to third prior arts cannot be used for an ordinary GO/NOGO testing, nor can it be used to measure a "true capability value" of the worst input threshold voltage (a distribution of the worst input threshold voltage of LSIs when a number of LSI is tested).

Next, the fourth prior art shown in FIG. 4A is so configured that the output buffer 1403 for outputting the signal 1406 indicative of the result of the signal processing in the normal mode is used as the output buffer even in the test mode, so that the output signal 1405 of the input buffer 1402 is outputted through the output buffer 1403 to the external. In this method, in the case that the number of output buffers is smaller than the number of input buffers, extra output buffers which are not required for the signal processing in the normal mode, must be added for only the input threshold voltage test. This results in an increase in the number of external terminals, and therefore, makes the size of the LSI large and lowers the package density of the LSI.

On the other hand, in the fifth prior art, the expected value of the output logic value for discriminating the non-defective/defective changes dependently upon an input buffer to be tested. In addition, for each input buffer to be tested, it is necessary to change the logic value applied to the input terminals other than to the input terminal connected to the input buffer to be tested. Therefore, how to change the input signal to be applied to the input terminal and the expected output value for the discrimination depend upon how the NAND gate 1609 receiving the output of the respective input buffers to be tested is connected in relation to the respective input terminals. In other words, a test pattern used for the input threshold voltage testing by use of an LSI tester, must be individually prepared for each of products, on the basis of the circuit connection information of each product. As a result, the number of steps for preparing the test pattern will increase the manufacturing cost of the LSI.

SUMMARY OF THE INVENTION

Accordingly, it is an object of the present invention to provide a semiconductor integrated circuit having an input buffer threshold voltage test circuit so configured as to overcome the above mentioned defects of the conventional ones.

Another object of the present invention is to provide a CMOS digital integrated circuit having a plurality of input buffers and provided with a test circuit for discriminating non-defective/defective of the threshold of the input buffers, on the basis of whether or not a power supply current increases, the circuit being capable of giving a definite comparison reference value for each of the high level threshold value testing and the low level threshold value testing, the circuit being also capable of enabling not only the GO/NOGO testing of the thresholds, but also the measurement of the "true capability value" of the input buffer having the worst threshold voltage.

Still another object of the present invention is to provide a CMOS digital integrated circuit having a plurality of input buffers and provided with a test circuit for discriminating non-defective/defective of the threshold of the input buffers on the basis of a logical condition of one output signal outputted to an external output terminal, the output signal for discriminating the non-defective/defective being only one, the logical condition of the one output signal and the logical condition of an input signal to be applied to each external input terminal being unconditionally determined independently of an input buffer to be tested.

The CMOS digital semiconductor integrated circuit in accordance with the present invention having a plurality of input buffers, comprises a first logic gate provided for each of said input buffers, for outputting an output logic value determined by an output logic value of a corresponding input buffer, and a second logic gate for designating a logic value to be outputted from said first logic gate, in accordance with an output logic determined by an external control signal, an output node of said first and second logic gates being interconnected to the same signal line, so that when at least one of said plurality of input buffers outputs a logic signal different from a logic signal expected in response to an input signal applied from an external and in accordance with said external control signal, the output logic values of said first and second logic gates become different from each other, whereby a signal collision occurs on said signal line, resulting in an increased power supply current.

Alternatively, the CMOS digital semiconductor integrated circuit in accordance with the present invention having a plurality of input buffers, comprises a precharge circuit for previously charging or discharging a potential monitor signal line in accordance with an external control signal, and switches each on-off controlled by a logic value of an output signal of a corresponding input buffer, for discharging or charging the potential monitor signal line, so that whether or not the input buffer generates an output signal of a logic value expected on the basis of an external input signal given to the input buffer, is determined on the basis of whether the logic value flips on the previously charged or discharged potential monitor signal line, and occurrence/non-occurrence of the flip of the logic value is decoded into a binary value, which is in turn outputted to the external output terminal.

The above and other objects, features and advantages of the present invention will be apparent from the following description of preferred embodiments of the invention with reference to the accompanying drawings.

BRIEF DESCRIPTION OF THE DRAWINGS

FIG. 10 is a circuit diagram of a second embodiment of the input threshold voltage measuring apparatus, on the basis of the first conception of the present invention;

DESCRIPTION OF THE PREFERRED EMBODIMENTS

Now, preferred embodiments of the present invention will be described with the accompanying drawings.

Figure 7:
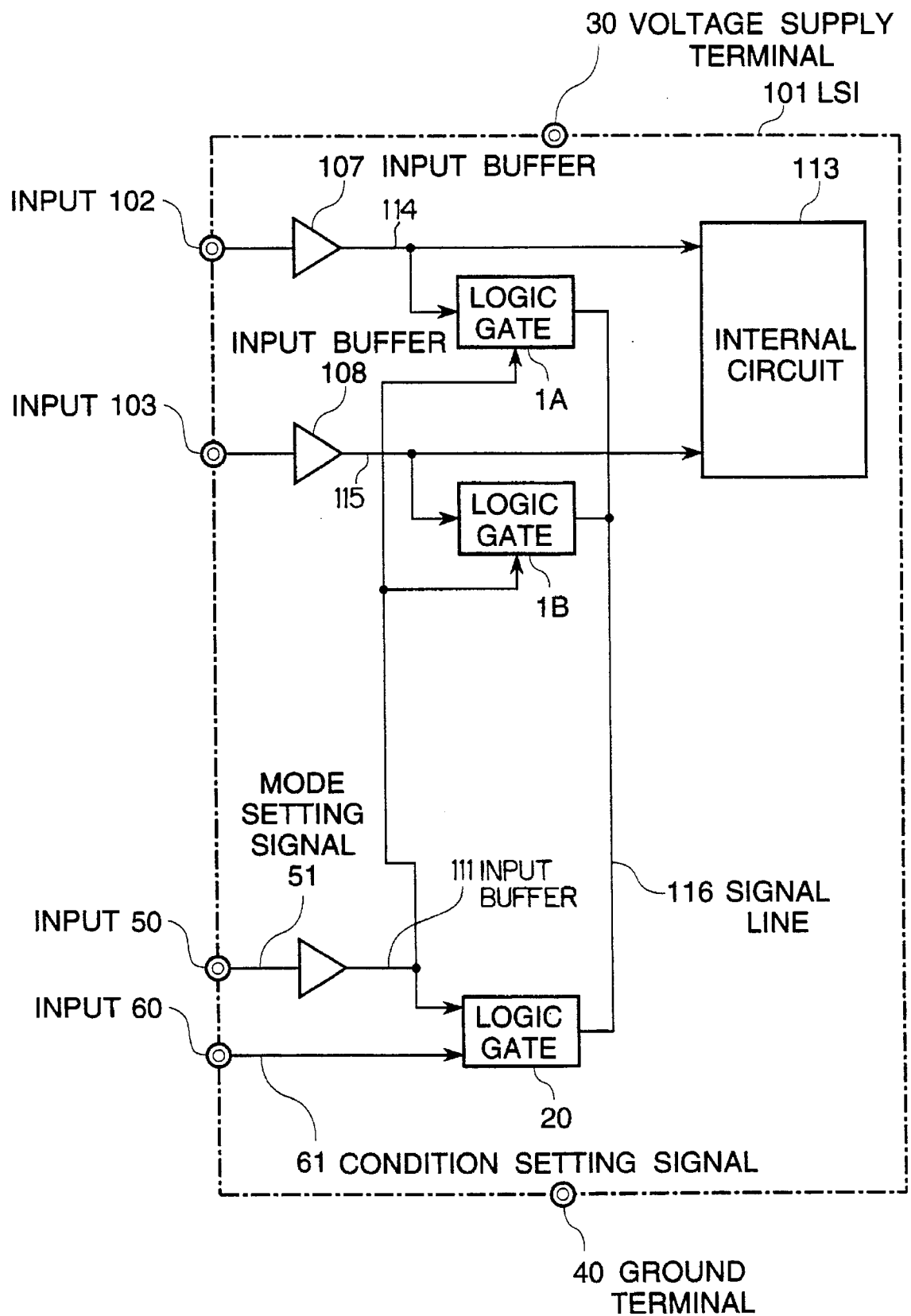
FIG. 7 is a block diagram of a first conceptual embodiment of the input threshold voltage measuring apparatus on the basis of the first conception of the present invention.

Referring to FIG. 7, there is shown a block diagram of a first conceptual embodiment of the input threshold voltage measuring apparatus in accordance with the present invention. In FIG. 7, an LSI 101 of the CMOS transistor structure includes an input buffer 107 receiving a digital data signal applied to an external input terminal 102. An output signal 114 of the input buffer 107 is supplied to an internal logic circuit 113 of the CMOS transistor structure, so that the output signal 114 is subjected to a predetermined signal processing in the internal logic circuit 113. The LSI 101 also includes an input buffer 108 receiving a data signal applied to an external input terminal 103. An output signal 115 of the input buffer 108 is supplied to the internal logic circuit 113 so as to be subjected to a predetermined signal processing in the internal logic circuit 113.

The above construction is a construction provided in a conventional LSI. Incidentally, in the shown conceptual embodiment, a number of similar input buffers are provided in the LSI, but for simplification of the drawing and the explanation and for making it easier to understand, it is deemed that only two input buffers are provided.

In the shown conceptual embodiment, the LSI 101 further includes a logic gate 1A receiving the output signal 114 of the input buffer 107, and a logic gate 1B receiving the Output signal 115 of the input buffer 108. An output node of the logic gate 1A and an output node of the logic gate 1B are interconnected by a signal line 116.

Furthermore, the LSI 101 includes an input buffer 111 receiving a test mode setting control signal (called simply a "mode setting signal" hereinafter) 51 applied to an external input terminal 50, and a two-input logic gate 20 having one input connected to an output of the input buffer 111. The mode setting signal 51 controls activation/deactivation of the output of the logic gates 1A and 1B, in bundle. Namely, the mode setting signal 51 controls the logic gates 1A and 1B so as to permit or inhibit an input signal applied to the logic gate to pass to the output of the logic gate. The other input of the logic gate 20 is connected to receive a test condition setting control signal (called simply a "condition setting signal" hereinafter) 61 applied to another external terminal 60. An output node of the logic gate 20 is also connected to the signal line 116.

In the above mentioned construction, the input terminals 102 and 103 are external terminals under test for the input threshold voltage testing. On the other hand, the input terminals 50 and 60 are not included in the external terminals under test for the input threshold voltage testing. The input terminal 50 receives the binary mode setting signal 51 for switching the mode of the LSI between a test mode for performing the input threshold testing and a normal mode in which an ordinary signal processing is performed. Therefore, an external terminal is ordinarily provided in most of LSIs for various testings including a function test of the LSI, and which is generally called a "test mode terminal" or simply a "test terminal", can be used as this input terminal 50. On the other hand, the input terminal 60 is used for receiving the condition setting signal 61 designating which of a high level input threshold voltage testing and a low level input threshold voltage testing should be executed in the input threshold voltage test mode. Therefore, the terminal 60 is indispensably required for the input threshold voltage test mode.

The LSI 101 also includes an external terminal 30 for supplying a power supply voltage into various circuits internally provided in the LSI 101, and a ground terminal 40 for supplying a ground potential.

Figure 8:
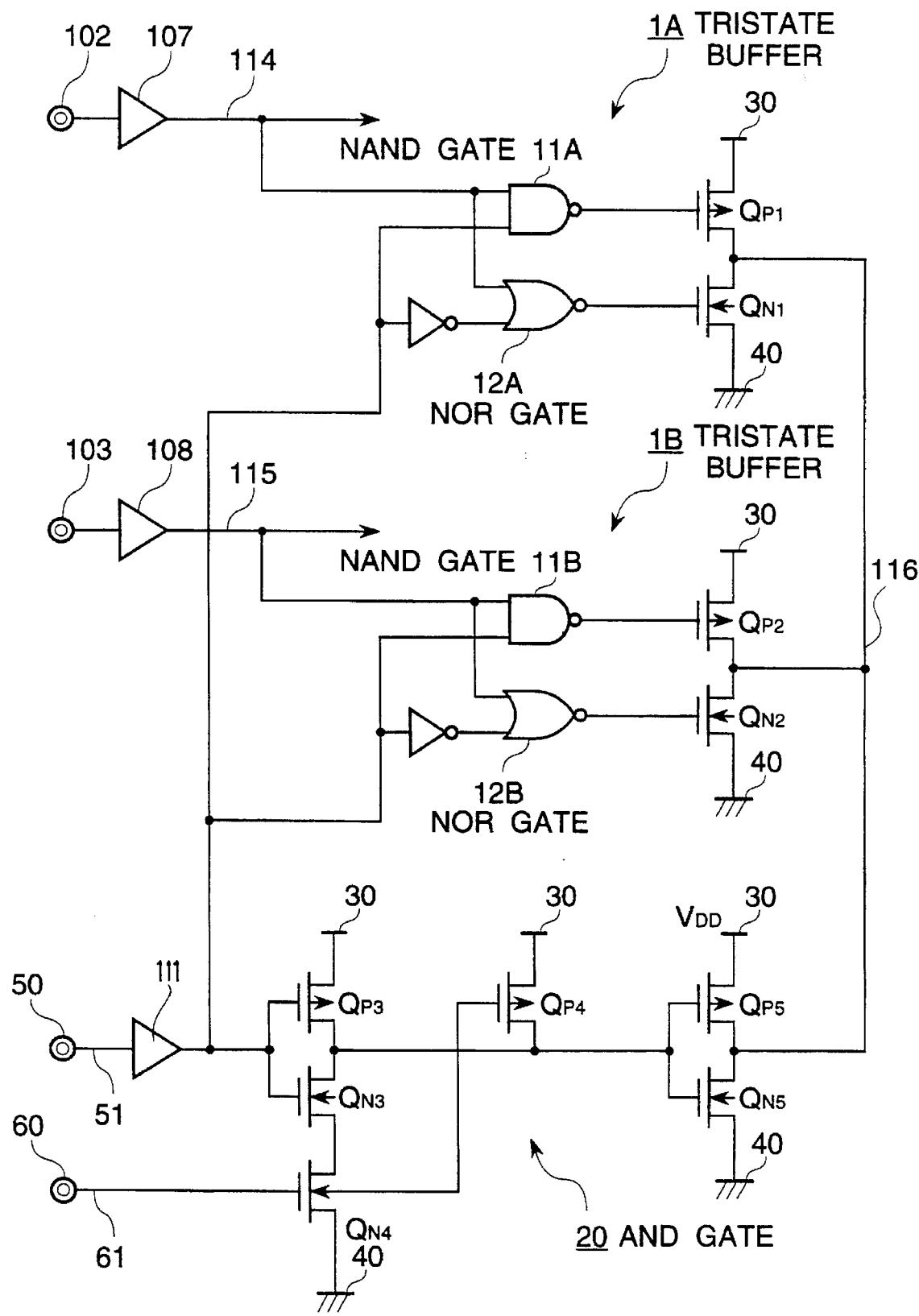
FIG. 8 is a circuit diagram of a first embodiment of the input threshold voltage measuring apparatus, on the basis of the first conception of the present invention.

In the above mentioned LSI 101 of the first conceptual embodiment, a method for performing the input threshold voltage testing for the input buffers 107 and 108, and an operation of the circuit in the testing, will be described in the following:

First, explanation will be made on a case in which each of the logic gates 1A and 1B is formed of a tristate buffer, and the logic gate 20 is composed of an AND gate. Referring to FIG. 8, there is shown a circuit diagram of a first embodiment of the input threshold voltage measuring apparatus having such a construction. However, the internal circuit 113 shown in FIG. 7 is omitted in FIG. 8 for simplification of the explanation.

As shown in FIG. 8, the tristate buffer 1A includes a CMOS inverter constituting an output stage and a logic circuit for controlling a pMOS transistor (p-channel MOS field effect transistor) and an nMOS transistor (n-channel MOS field effect transistor) which cooperate to constitute the CMOS inverter. The CMOS inverter of the output stage includes a pMOS transistor $Q_{P1}$ connected between the power supply terminal 30 and an output node (namely, the signal line 116), and an nMOS transistor $Q_{N1}$ connected between the output node and the ground terminal 40. The pMOS transistor $Q_{P1}$ is connected to receive an output of a two-input NAND gate 11A, and the nMOS transistor $Q_{N1}$ is connected to receive an output of a NOR gate 12A.

The NAND gate 11A has its one input connected to receive the output signal 114 of the input buffer 107 and its other input connected to receive through the input buffer 111 the mode setting signal 51 applied to the input terminal 50. The NOR gate 12A has its one input connected to receive the output signal 114 of the input buffer 107 and its other input connected to receive an inverted signal of the mode setting signal 51.

The output of the input buffer 108 is connected to the tristate buffer 1B similar to the tristate buffer 1A. This tristate buffer 1B includes a two-input NAND gate 11B receiving the output signal 115 of the input buffer 108 and the mode setting signal 51, a two-input NOR gate 12B receiving the output signal 115 of the input buffer 108 and an inverted signal of the mode setting signal 51, a pMOS transistor $Q_{P2}$ having a gate connected to receive an output signal of the NAND gate 11B, and an nMOS transistor $Q_{N2}$ having a gate connected to receive an output signal of the NOR gate 12B, the pMOS transistor $Q_{P2}$ and the nMOS transistor $Q_{N2}$ constituting an output stage.

On the other hand, the AND gate 20 is composed of a two-input NAND gate receiving the mode setting signal 51 applied to the input terminal 50 and the condition setting signal 61 applied to the input terminal 60, and a CMOS inverter receiving an output signal of the two-input NAND gate for outputting an inverted output signal of the two-input NAND gate. More specifically, the NAND gate at the input side includes a pMOS transistor $Q_{P3}$, an nMOS transistor $Q_{N3}$ and an nMOS transistor $Q_{N4}$, which are connected in the named order in series between the power supply terminal 30 and the ground terminal 40, the pMOS transistor $Q_{P3}$ and the nMOS transistor $Q_{N3}$ having their gate connected in common to each other. The NAND gate also includes a pMOS transistor $Q_{P4}$ connected between the power supply terminal 30 and a series-connected node between the pMOS transistor $Q_{P3}$ and the nMOS transistor $Q_{N3}$. The commonly connected gates of the pMOS transistor $Q_{P3}$ and the nMOS transistor $Q_{N3}$ is connected to receive the mode setting signal 51. A gate of the pMOS transistor $Q_{P4}$ and the nMOS transistor $Q_{N4}$ is connected in common to receive the condition setting signal 61.

On the other hand, the CMOS inverter at the output side includes a pMOS transistor $Q_{P5}$ and an nMOS transistor $Q_{N5}$ connected in series between the power supply terminal 30 and the ground terminal 40.

With the above mentioned arrangement, the outputs of the three CMOS inverters are connected in common to the signal line 116. Namely, the series-connected node between the pMOS transistor $Q_{P1}$ and the nMOS transistor $Q_{N1}$, the series-connected node between the pMOS transistor $Q_{P2}$ and the nMOS transistor $Q_{N2}$, and the series-connected node between the pMOS transistor $Q_{P5}$ and the nMOS transistor $Q_{N5}$, are connected to the signal line 116.

Figure 9A:
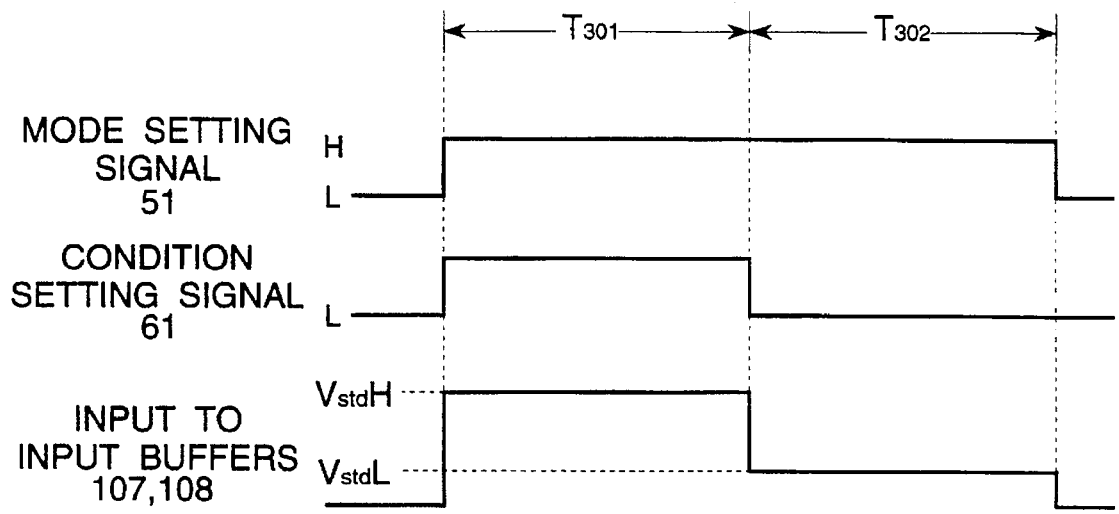
FIGS. 9A, 9B and 9C are timing charts illustrating waveforms in operation of the input threshold voltage measuring apparatus shown in FIG. 8.
Figure 9B:
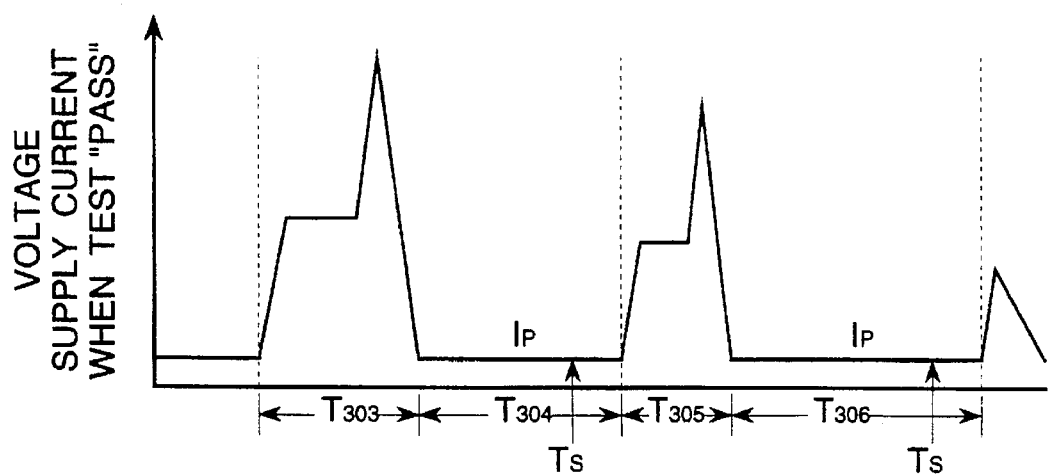
Figure 9C:
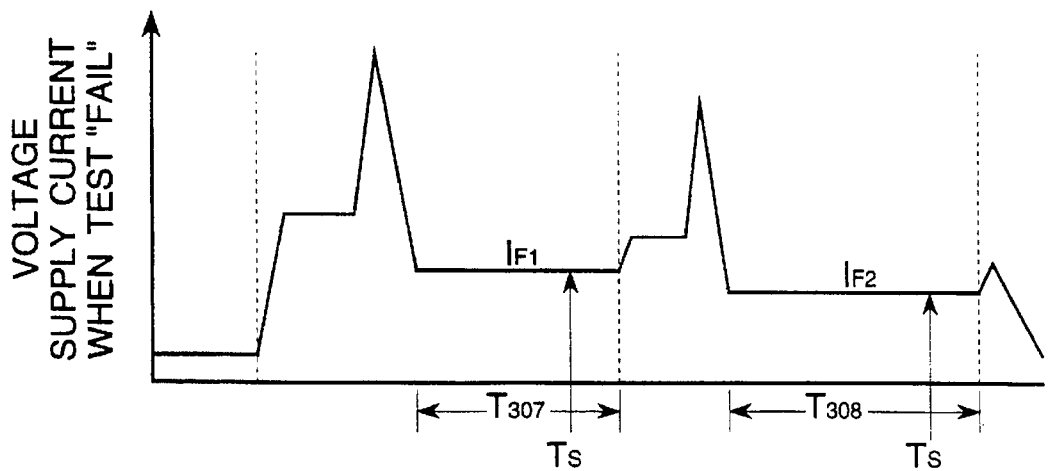

Here, referring to FIG. 9A, there is shown a timing chart illustrating the mode setting signal 51 applied to the input terminal 50, the condition setting signal 61 applied to the input terminal 60, and an input signal applied to the input terminals 102 and 103. FIG. 9B shows a waveform of the power supply current (which flows from the power supply terminal 30 to the ground terminal 40) of the LSI 101 when it passes the input threshold voltage test ("PASS"). On the other hand, FIG. 9C shows a waveform of the power supply current (which flows from the power supply terminal 30 to the ground terminal 40) of the LSI 101 when it fails the input threshold voltage test ("FAIL").

As shown in FIG. 9A, in order to execute the input threshold voltage test, first of all, the mode setting signal 51 applied to the terminal 50 is brought from a low level to a high level. With this, since the one input of the NAND gate 11A in the tristate buffer 1A is brought to the high level, the NAND gate 11A becomes equivalent to an NOT gate receiving the output signal 114 of the input buffer 107. On the other hand, since the one input of the NOR gate 12A is brought to the low level, the NOR gate 12A becomes equivalent to an NOT gate receiving the output signal 114 of the input buffer 107, similarly to the NAND gate 11A. As a result, the pMOS transistor $Q_{P1}$ and the nMOS transistor $Q_{N1}$, which constitute the output stage of the tristate buffer, become equivalent to an inverter receiving the inverted signal of the signal 114. In other words, by bringing the mode setting signal 51 to the high level, the tristate buffer 1A is activated to operate as a gate which receives the output signal 114 of the input buffer 107 and outputs an output signal having the same phase as that of the output signal 114.

In a similar manner, the tristate buffer 1B provided for the input buffer 108 is activated by the high level of the mode setting signal 51, so as to operate as a gate which receives the output signal 115 of the input buffer 108 and outputs an output signal having the same phase as that of the output signal 115.

Thus, in this conceptual embodiment, by the common mode setting signal 51, the two tristate buffers 1A and 1B are brought together into an output activated condition capable of outputting an output signal in response to the input signal. On the other hand, since one input of the AND gate 20 is brought to the high level by the mode setting signal 51, the AND gate 20 becomes equivalent to a buffer which receives the condition setting signal 61 applied to the input terminal 60 and which outputs an output signal having the same phase as that of the condition setting signal 61. Namely, the AND gate 20 is in a condition that an output logic value can be determined by the condition setting signal 61.

In this condition, firstly, the testing of the high level input threshold voltage generally called "VIH" (called the "VIH test" hereinafter) is performed. In this test, the condition setting signal 61 is brought to the high level, indicating that the test is the VIH test and the logic level to be outputted from the tristate buffers 1A and 1B is the high level. Then, a standardized voltage VstdH to be fulfilled by an input buffer under test in the VIH test is applied to the input terminals 102 and 103.

First, explanation will be made on a case that both of the input buffers 107 and 108 operate normally and therefore pass the VIH test (namely, the input threshold voltage of the two input buffers 107 and 108 are lower than the standardized voltage VstdH applied to the input terminal). In this case, both the output signal 114 of the input buffer 107 and the output signal 115 of the input buffer 108 are brought to the high level. In response to the change of these output signals 114 and 115, the internal circuit 113 (shown in FIG. 7) operates, so that the operation current flows. Thus, as shown in a period T303 of FIG. 9B, the power supply current increases. However, if the state transition of the signal has completed and therefore if the internal circuit returns into a stable condition, this operation current disappears.

As mentioned above, both of the tristate buffers 1A and 1B are in the output activated condition, and both the output signal 114 of the input buffer 107 and the output signal 115 of the input buffer 108 are at the high level. Accordingly, both of the tristate buffers 1A and 1B output the high level signal onto the signal line 116. In addition, the AND gate 20 outputs the high level signal onto the signal line 116. On the signal line 116, the output signals 114 and 115 of the input buffers 107 and 108 and the output of the AND gate 20 do not collide with each other. In this condition, examining the on-off condition of the MOS transistors, all of the three pMOS transistors $Q_{P1}$, $Q_{P2}$ and $Q_{P5}$ are on, and all of the three nMOS transistors $Q_{N1}$, $Q_{N2}$ and $Q_{N5}$ are off. Namely, a current path from the power supply terminal 30 through the signal line 116 to the ground terminal 40 is cut off by the three nMOS transistors, and therefore, no current flows through this current path.

Therefore, only static current flows from the power supply terminal 30 in a period (period T304 of FIG. 9B) after the operation current caused by the state transition of the signals 114 and 115 disappears. This static current includes a junction leak current of the MOS transistors, which is remarkably smaller than the operation current which occurs when the input buffers and the internal circuit flip. The value of this static current is shown as IP in the period T304 of FIG. 9B.

Next, the low level input threshold voltage test (called the "VIL test" hereinafter) is performed. First, explanation will be made on a case that both of the input buffers 107 and 108 operate normally and therefore pass the test (namely, the input threshold voltage of the two input buffers 107 and 108 are higher than the standardized voltage VstdL). In this test, as shown in a period T302 of FIG. 9A, the condition setting signal 61 is brought to the low level, indicating that the test is the VIL test and the logic level to be outputted from the tristate buffers 1A and 1B is the low level. On the other hand, the high level of the mode setting signal 50 is applied to the input terminal 50, similarly to the VIH test. Namely, in this case, the tristate buffers 1A and 1B operate as gates which receive the output signal 114 of the input buffer 107 and the output signal 115 of the input buffer 108, respectively, and output an output signal having the same phase as that of the input signal. Then, a standardized voltage VstdL to be fulfilled by the input buffers 107 and 108 in the VIL test is applied to the input terminals 102 and 103 under test. As a result, both the output signal 114 of the input buffer 107 and the output signal 115 of the input buffer 108 are brought to the low level. As mentioned above, in response to the change of these signals, the operation current flows in a period T305 (FIG. 9B), so that the power supply current increases. Thereafter the operation current disappears.

As mentioned above, both of the tristate buffers 1A and 1B are in the output activated condition, and both the input buffer 107 and the input buffer 108 operate normally to output the output signal 114 of the low level and the output signal 115 of the low level, respectively. Accordingly, both of the tristate buffers 1A and 1B output the low level signal onto the signal line 116. In addition, the AND gate 20 outputs the low level signal onto the signal line 116. On the signal line 116, therefore, the output signals 114 and 115 of the input buffers 107 and 108 and the output signal of the AND gate 20 do not collide with each other. In this condition, examining the on-off condition of the MOS transistors, all of the three pMOS transistors $Q_{P1}$, $Q_{P2}$ and $Q_{P5}$ are off, and all of the three nMOS transistors $Q_{N1}$, $Q_{N2}$ and $Q_{N5}$ are on. Namely, a current path from the power supply terminal 30 through the signal line 116 to the ground terminal 40 is cut off by the three pMOS transistors, and therefore, no current flows through this current path.

Therefore, only static current flows from the power supply terminal 30 in a period (period T306 of FIG. 9B) after the operation current caused by the state transition of the signals 114 and 115 disappears. The value of this static current is as extremely small as the static current IP in the VIH test.

The above mentioned explanation is the description of the operation when the LSI 101 passes the VIH test and the VIL test. Next, an operation in the case that the LSI 101 fails the test with reference to FIG. 9C.

Now, assume that, in the VIH test, the input buffer 107 operates normally but the input buffer 108 malfunctions. Namely, the case is that the threshold voltage of the input buffer 107 is lower than the standardized voltage VstdH of the high level applied to the input terminals 102 and 103, but the threshold voltage of the input buffer 108 is higher than the standardized voltage VstdH. Since the input buffer 107 operates normally, the output signal 114 is brought to the high level, and therefore, the tristate buffer 1A drives the signal line 116 to the high level. On the other hand, the malfunctioning input buffer 108 brings the output signal 115 to the low level, so that the tristate buffer 1B drives the signal line 116 to the low level. In addition, the AND gate 20 drives the signal line 116 to the high level. In this case, of the three pMOS transistors QP1, QP2 and QP5, the pMOS transistors QP1 and QP5 are on and the pMOS transistor QP2 is off. On the other hand, of the three nMOS transistors QN1, QN2 and QN5, the nMOS transistors QN1 and QN5 are off and the nMOS transistor QN2 is on. As a result, in the current path flowing from the power supply terminal 30 through the signal line 116 to the ground 40, a current flows through the pMOS transistors QP1 and through the nMOS transistors QN2, and another current flows through the pMOS transistors QP3 and through the nMOS transistors QN2. These currents continue to constantly flow even after the operation current caused by the state transition of the signals 114 and 115 in the period T303 of FIG. 9C disappears in a period T307 of FIG. 9C, unless the level of the input signals applied to the input terminals 102, 103 and 60 changes. This current is indicated as IF1. This current IF1 is determined by the power supply voltage, an on resistance of the pMOS transistor and an on resistance of the nMOS transistor, and is remarkably larger than the current IP which flows when it passes the test. Namely, as shown in FIGS. 9B and 9C, when it fails the VIH test (period T301), the power supply current IF1 is greatly larger than the current IP which flows when it passes the test, flows in the period T307.

Alternatively, assume another situation in which, in the VIL test during the period T302, all the input terminals fails the test (namely, the case is that the threshold voltage of each of the input buffers is lower than the standardized voltage VstdL of the low level applied to each input terminal). In this situation, the standardized voltage VstdL to be fulfilled in the VIL test is applied to the input terminals 102 and 103, respectively, but since both the input buffers 107 and 108 malfunction, both the output signals 114 and 115 are brought to the high level. Therefore, both the tristate buffers 1A and 1B drive the signal line 116 to the high level. On the other hand, at the time of the VIL test, the condition setting signal 61 of the low level is applied to the input terminal 60 in order to indicate the output logic value to be outputted from the tristate buffers 1A and 1B is the low level. Therefore, the AND gate 20 drives the signal line 116 to the low level. As a result, on the signal line 116, the output signals of the tristate buffers 1A and 1B and the output signal of the AND gate 20 collide. In this case, of the three pMOS transistors QP1, QP2 and QP5, the pMOS transistors QP1 and QP2 are on and the pMOS transistor QP5 is off. On the other hand, of the three nMOS transistors QN1, QN2 and QN5, the nMOS transistors QN1 and QN2 are off and the nMOS transistor QN5 is on. Therefore, even after the operation current caused by the operation of the internal circuit has disappeared in a period T308 of FIG. 9C, in the current path flowing from the power supply terminal 30 through the signal line 116 to the ground 40, a current constantly flows through the pMOS transistors QP1 and through the nMOS transistors QN5, and another current constantly flows through the pMOS transistors QP2 and through the nMOS transistors QN5. This current IF2 is remarkably larger than the current IP which flows when it passes the test, similarly to the current IF1 in the above mentioned situation in which it fails the VIH test.

As mentioned above, in this embodiment, when even one of the tristate buffers 1A and 1B outputs a logic signal different from the logic signal designated by the AND gate 20, namely when even only one of the plurality of input buffers does not fulfil the standardized value of the threshold voltage, the signal collision occurs on the signal line 116, so that the current flows form the power supply terminal 30 in the logic gate driving the signal line 116 to the high level, to the ground terminal in the logic gate driving the signal line 116 to the low level, with the result that the increased power supply current constantly flows. In the shown embodiment, by measuring the above mentioned power supply currents IP, IF1 and IF2 externally, it is possible to discriminate the pass or the failure of the VIH test and the VIL test. Namely, a power supply current in the LSI is measured at a time Ts during the periods T304, T306, T307 and T308 in FIGS. 9B and 9C, in order to discriminate whether or not the input threshold voltage of all the input buffers meets with the standardized value. A discrimination reference in this case will be described in the following:

The power supply current IP when the LSI passes the VIH test and the VIL test includes only the pn junction leakage current of the MOS transistors as mentioned hereinbefore, and therefore, is not larger than 1 µA even in a high integration LSI. Next, consider the power supply current in the case that the LSI fails the VIH test and the VIL test. In this case, the power supply current becomes maximum when about a half of all the input buffers pass the test, but the remaining half of the input buffers fail the test. To the contrary, the power supply current becomes minimum, when only one of all the input buffers fails the test, and alternatively, when all the input buffers fail the test. In both the cases, a factor of the power supply current is a channel current flowing in a source-drain path of the MOS transistor, and therefore, even if it is a situation of minimizing the power supply current, the magnitude of the power supply current exceeds 1 mA. Accordingly, the power supply current at the measuring point T1 when the LSI fails the input threshold voltage test, is at least 1000 times the power supply current at the measuring point Ts when the LSI passes the input threshold voltage test. Namely, both is clearly distinguishable. By setting the discrimination reference current value to an intermediate level between the two current levels, no discrimination error will occur. Specifically, by utilizing a power supply current measuring function which is for example an ordinary function of an LSI tester, it is possible to realize the discrimination efficiently and with a high precision.

Now, as a second embodiment of the input threshold voltage measuring apparatus shown in FIG. 7, an example in which the logic gates 1A and 1B are constituted of a transfer gate and the logic gate 20 is formed of an AND gate, will be explained. FIG. 10 shows a circuit diagram of this second embodiment. Each of the input buffers 107 and 108 is composed of two cascaded inverter stages of a conventional CMOS transistor structure. Accordingly, in this embodiment, an output node of the CMOS inverter of the output stage of the input buffer 107 and an output node of the CMOS inverter of the output stage of the input buffer 108 are connected through nMOS transistors 1A and 1B of the transfer gate, respectively, and also through the signal line 116 to an output node of the CMOS inverter of the output stage of the AND gate 20. A gate of each of the nMOS transistors (transfer gates) 1A and 1B is connected to receive the mode setting signal 51 applied to the input terminal 50 from an external source. Therefore, by setting the mode setting signal 51 to the high level, the two transfer gates 1A and 1B are both put into a conductive condition. Alternatively, by setting the mode setting signal 51 to the low level, the two transfer gates 1A and 1B are both put into a non-conductive condition.

In this embodiment, when the LSI 101 passes the $V_{IH}$ test, the signal line 116 is driven to the high level by the input buffers 107 and 108 and the AND gate 20. Namely, no signal collision occurs on the signal line 116. Therefore, similarly to the above mentioned first embodiment, the current path flowing from the power supply terminal 30 through the signal line 116 to the ground terminal 10 blocked by the three nMOS transistors in the off condition. The power supply current during the period T304 in FIG. 9B includes only the pn junction leakage current of the MOS transistors, and therefore, is as extremely small as not greater than 1 μA.

However, if the input buffer 107 fails the $V_{IH}$ test but the input buffer 108 passes the $V_{IH}$ test, the input buffer 107 drives the signal line 116 to the low level, and the input buffer 108 and the AND gate 20 drive the signal line 116 to the high level. Namely, a signal collision occurs on the signal line 116. In this case, a pMOS transistor of the output stage inverter of the input buffer 108 and a pMOS transistor of the output stage inverter of the AND gate 20 are in an on condition, and a pMOS transistor of the output stage inverter of the input buffer 107 is in an off condition. Accordingly, the current path flowing from the power supply terminal 30 through the signal line 116 to the ground terminal 40 includes a current flowing from the input buffer 108 to the input buffer 107 and another current flowing from the AND gate 20 to the input buffer 107. Thus, the power supply current during the period T307 in FIG. 9C becomes on the order of not less than 1 mA. In this manner, it is possible to certainly discriminate the pass or the failure of the $V_{IH}$ test.

In the $V_{IL}$ test, on the other hand, the condition setting signal 61 of the low level is applied to the input terminal, in order to indicate that the logical level of the signal to be outputted from each input buffer is the low level. In this designation, if all the input buffers operate normally so as to output the low level signal, no signal collision occurs on the signal line 116, so that the power supply current during the period T306 in FIG. 9B constantly becomes as extremely small as not larger than 1 μA. On the other hand, if even only one of the input buffers 107 and 108 fails the test, so as to output the high level signal, a signal collision occurs on the signal line 116. In this case, between the power supply terminal 30 and the ground terminal 40, there are formed a current path flowing from the failed input buffer to another normal input buffer and another current path flowing from the failed input buffer to the AND gate 20. As a result, the power supply current during the period T308 in FIG. 9C constantly becomes on the order of not less than 1 mA. In this manner, it is possible to certainly discriminate the pass or the failure of the $V_{IL}$ test.

In the above mentioned first and second embodiments, the logic gate 20 is composed of the two-input AND gate, but can be constituted of an OR gate. Because, when one input of the two-input OR gate is at the low level, the OR gate becomes equivalent to a gate outputting a signal having the same phase as that of an input signal applied to the other input of the OR gate. When the one input of the two-input OR gate is at the high level, the output logic of the OR gate is the same as the output logic of the AND gate. However, in this case, it is necessary to apply an inverted signal of the mode setting signal 51 to the OR gate used as the logic gate 20. In this arrangement, when the mode setting signal 51 is brought to the high level, the tristate buffers or the transfer gates used as the logic gates 1A and 1B and the OR gate used as the logic gate 20, are brought into an output activated condition, so that the circuit operates similarly to the above mentioned first and second embodiments. On the other hand, if the mode setting signal 51 is brought to the low level in order to designate the normal mode, the OR gate used as the logic gate 20 outputs the high level signal regardless of the logic level of the condition setting signal 61. In this case, the tristate buffers or the transfer gates used as the logic gates 1A and 1B are in a floating condition. Accordingly, no signal collision occurs on the signal line 116. Namely, the power supply current does not increase, so that there is no hindrance to an ordinary signal processing of the LSI.

The above mentioned first and second embodiments have been constructed so that when the condition setting signal is at the high level, the $V_{IH}$ test is performed, and when the condition setting signal is at the low level, the $V_{IL}$ test is performed. This is in order to avoid a feeling of a physical disorder. However, if it is allowed that when the condition setting signal is at the low level, the $V_{IH}$ test is performed, and when the condition setting signal is at the high level, the $V_{IL}$ test is performed, the logic gate (AND gate) 20 in the first and second embodiments can be replaced with a NAND gate, in order to reduce the necessary number of transistors. Because both the AND gate and the NAND gate have such as feature that when one input is at the high level, the logic level of the output signal is determined by only the logic level of the other input, but the output logic of the AND gate is opposite to the output logic of the NAND gate.

Furthermore, the logic gate 20 of the first and second embodiments can be constituted of a NOR gate. When one input of the NOR gate is at the low level, the NOR gate becomes equivalent to a NOT gate which outputs an inverted signal of an input signal applied to the other input. When the one input of the NOR gate is at the high level, the logic level of the output signal of the NOR gate becomes equivalent to the logic level of the output signal of the NAND gate.

The following is the feature of the circuit structure of the first and second embodiments as mentioned above:

(1) The output logic level of the logic gate 20 can be freely set to a desired logic level by the condition setting signal applied from an external source.

(2) The output logic level of the logic gates 1A and 1B is determined by the output logic level of the associated input buffer, and when the input buffer operates normally in response to the input signal applied from the external (namely, a logic level signal as expected), the output logic level of the logic gates 1A and 1B is in the same phase as that of the output signal of the logic gate 20.

(3) The output of the logic gates 1A and 1B are activated and deactivated together by a common control signal.

The combination of the logic gate 1A (1B) and the logic gate 20, which fulfil the above mentioned condition, is not limited to the first and second embodiments as mentioned above. For example, the logic gates 1A and 1B can be composed of an AND gate and the logic gate 20 can also be composed of an AND gate. In this case, the mode setting signal 51 is applied to one input of a two-input AND gate used as the logic gates 1A and 1B. With this arrangement, when the mode setting signal 51 is at the high level, the AND gates 1A and 1B operate equivalently to a non-inverting gate receiving, as an input signal, the output signal 114 or 115 of each input buffer 107 or 108. On the other hand, when the mode setting signal 51 is at the low level, the output of the AND gates 1A and 1B is fixed to the low level, regardless of the output logic level of the input buffer. Namely, the activation and deactivation of the output is controlled commonly by the mode setting signal. In addition, when the output is activated, the output logic level is determined by the output logic level of the input buffer. Furthermore, if the input buffers 107 and 108 operate normally, the AND gates 1A and 1B and the AND gate 20 output the output signal of the same phase. Here, generally, the AND gate has such as construction that an output signal of a NAND gate is inverted by an output stage inverter, as the AND gate 20 shown in FIG. 8. Namely, if all the logic gates 1A and 1B and the logic gate 20 are composed of the AND gate, the output stage inverter of each logic gate (AND gate) drive the common signal line 116. In other words, it becomes equivalent to the circuit construction of the second embodiment shown in FIG. 10. In this case, accordingly, similarly to the first embodiment, whether or not all the input buffers output an expected logic level signal, namely, whether or not the threshold voltage of all the input buffers meets with the standardized value, can be discriminated on the basis of whether or not the power supply current is at an increased constant value.

Alternatively, as another example, the logic gates 1A and 1B can be constituted of an OR gate, and a logic gate 20 can be also composed of an OR gate. In this case, an inverted signal of the mode setting signal 51 is applied to an input of these OR gates 1A, 1B and 20. With this arrangement, when the mode setting signal 51 is at the high level, both the OR gates 1A and 1B become equivalent to an non-inverted gate receiving the output signal 114 of the input buffer 107 and the output signal 115 of the input buffer 108. On the other hand, when the mode setting signal 51 is at the low level, the output logic level of these OR gates 1A and 1B is fixed to the high level, regardless of the output logic level of the input buffers 107 and 108. The output activation and deactivation is controlled in bundle by the mode setting signal, and when the output is in the activated condition, the output logic value is determined by the output logic value of the associated input buffer. In addition, if the input buffers 107 and 108 operate normally, the OR gates 1A and 1B and the OR gate 20 output the same phase signal. Generally, the OR gate has such a construction that an output signal of a NOR gate is inverted by an inverter of an output stage. Namely, if all of the logic gates 1A, 1B and 20 are constituted of the OR gate, the inverter of the output stage in each of the logic gates drives the common signal line 116. In other words, the circuit becomes equivalent to the circuit construction of the first embodiment shown in FIG. 8. Therefore, in this case, accordingly, similarly to the first embodiment, whether or not all the input buffers output an expected logic level signal, namely, whether or not the threshold voltage of all the input buffers meets with the standardized value, can be discriminated on the basis of whether or not the power supply current is at an increased constant value.

Figure 11:
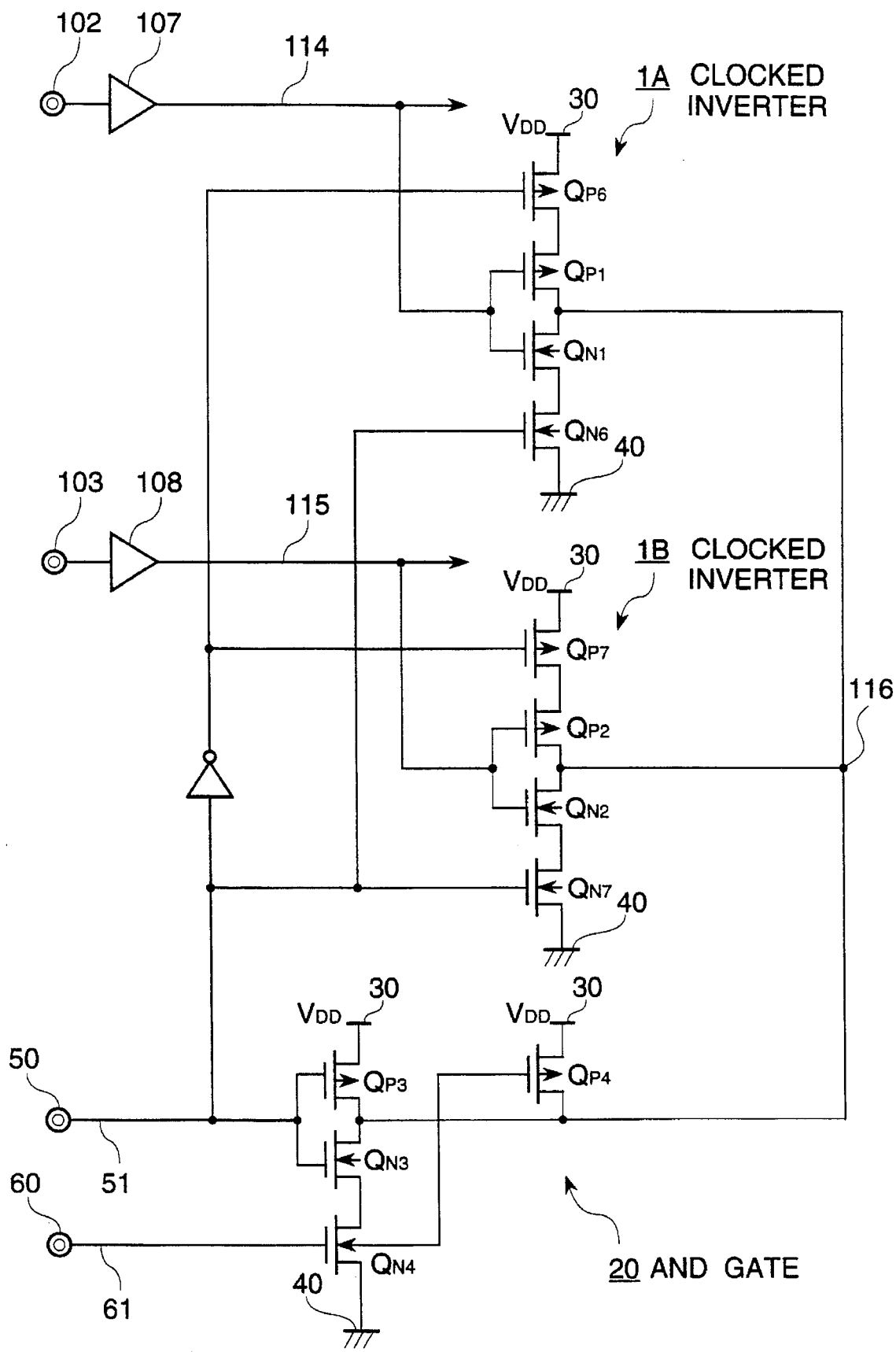
FIG. 11 is a circuit diagram of a third embodiment in accordance with the input threshold voltage measuring apparatus, on the basis of the first conception of the present invention.

Now, explanation will be made on a third embodiment of the input threshold voltage measuring apparatus shown in FIG. 7, in which each of the logic gates 1A and 1B is formed of a clocked inverter, and the logic gate 20 is composed of a NAND gate. Referring to FIG. 11, there is shown a circuit diagram, at a transistor level, of the third embodiment. However, the internal circuit 113 shown in FIG. 7 is omitted for simplification of the explanation, similarly to the drawings referred to in the above explanation.

As shown in FIG. 11, for example a clock inverter 1A has a CMOS inverter composed of a pMOS transistor $Q_{P1}$ and an nMOS transistor $Q_{N1}$, a pMOS transistor $Q_{P6}$ connected between the CMOS inverter and the power supply terminal 30, and an nMOS transistor $Q_{N6}$ connected between the CMOS inverter and the ground terminal 40. Gates of the pMOS transistor $Q_{P1}$ and the nMOS transistor $Q_{N1}$ are connected in common to receive a data signal (in this example, the output signal 114 of the input buffer 107). Gates of the pMOS transistor $Q_{P6}$ and the nMOS transistor $Q_{N6}$ are each connected to receive a control signal having a phase opposite to each other, respectively. In this example, the mode setting signal 51 applied to the input terminal 50 is applied to the gate of the nMOS transistor $Q_{N6}$, and an inverted signal of the mode setting signal 51 is applied to the gate of the pMOS transistor $Q_{P6}$. With this arrangement, when the mode setting signal 51 is a the high level, the clocked inverter 1A becomes equivalent to an inverter, since both the pMOS transistor $Q_{P6}$ and the nMOS transistor $Q_{N6}$ are turned on. Therefore, the clocked inverter 1A outputs the inverted signal of the signal 114 to the signal line 116. On the other hand, when the mode setting signal 51 is at the low level, both the pMOS transistor $Q_{P6}$ and the nMOS transistor $Q_{N6}$ are turned off, blocking the signal 114. A clocked inverter 1B located at the rear stage of the input buffer 108 has the same construction as that of the clocked inverter 1A as mentioned above. In this embodiment, the output activation and deactivation of both the clocked inverters 1A and 1B are controlled together by the common mode setting signal.

Here, assume that the mode setting signal 51 is brought to the high level to instruct execution of the input threshold voltage test. In this situation, the clocked inverters 1A and 1B become equivalent to a NOT gate receiving the output signal 114 of the input buffer 107 and the output signal 115 of the input buffer 108, respectively. In addition, the NAND gate 20 becomes equivalent to a NOT gate receiving the condition setting signal 61. In this condition, if the condition setting signal 61 is brought to the high level indicative of the $V_{IH}$ test, transistors $Q_{P3}$ and $Q_{P4}$ in the NAND gate 20 are turned off, and transistors $Q_{N3}$ and $Q_{N4}$ are turned on, so that the NAND gate 20 drives the signal line to the low level. At this time, if the input buffers 107 and 108 operate normally, these input buffers output the high level signal in response to the standardized voltage applied to the input terminals 102 and 103, respectively. Therefore, the transistors $Q_{P1}$ and $Q_{P2}$ in the two clocked inverters 1A and 1B are turned off, and the transistors $Q_{N1}$ and $Q_{N2}$ are turned on. Therefore, both the two clocked inverters 1A and 1B drives the signal line 116 to the low level. Accordingly, no signal collision occurs on the signal line 116. In this case, the current path flowing from the power supply terminal 30 through the signal line 116 to the ground terminal 40 is cut off by the four pMOS transistors $Q_{P1}$, $Q_{P2}$, $Q_{P3}$ and $Q_{P4}$, so that no power supply current flows through this current path.

On the other hand, for example, if the input buffer 107 fails the test, since the input signal applied to the clocked inverter 1A becomes the low level, in place of the high level which should be inherent, the transistor $Q_{P1}$ is turned on and the transistors $Q_{N1}$ is turned off, so that the inverter 1A drives the signal line 116 to the high level. Namely, a signal collision occurs on the signal line 116. Thus, in this case, the power supply current is increased by a current flowing through the pMOS transistors QP6 and QP1 and the pMOS transistors QN2 and QN7 and another flowing through the pMOS transistors QP6 and QP1 and the pMOS transistors QN3 and QN4. Therefore, it is possible to clearly discriminate the pass and failure of the VIH test on the basis of whether or not the power supply current has increased.

Next, for the VIL test, the condition setting signal 61 is brought to the low level, so as to indicate that the clocked inverters 1A and 1B should output the high level signal to the signal line 116. In this condition, if the input buffers 107 and 108 operate normally, since the output signal of the clocked inverters 1A and 1B become the high level, no signal collision occurs on the signal line 116. At this time, the current path flowing from the power supply terminal 30 through the signal line 116 to the ground terminal 40 is cut off by the three nMOS transistors QN1, QN2 and QN3.

On the other hand, for example, if the input buffer 107 fails the test, since the signal 114 becomes the high level, in place of the low level which should be inherent. In the clocked inverter 1A, therefore, the transistor QP1 is turned off and the transistors QN1 is turned on, so that the inverter 1A outputs the low level signal to the signal line 116. Namely, a signal collision occurs on the signal line 116. Thus, in this case, the power supply current is increased by a current flowing through the pMOS transistors QP7 and QP2 and the pMOS transistors QN1 and QN6 and another flowing through the pMOS transistor QP4 and the pMOS transistors QN1 and QN6. Therefore, it is possible to clearly discriminate the pass and failure of the VIL test on the basis of whether or not the power supply current has increased.

Incidentally, in this third embodiment, the logic gate 20 can be constituted of a NOR gate, an AND gate or an OR gate, in place of the NAND gate, similarly to the first and second embodiments.

Figure 12:
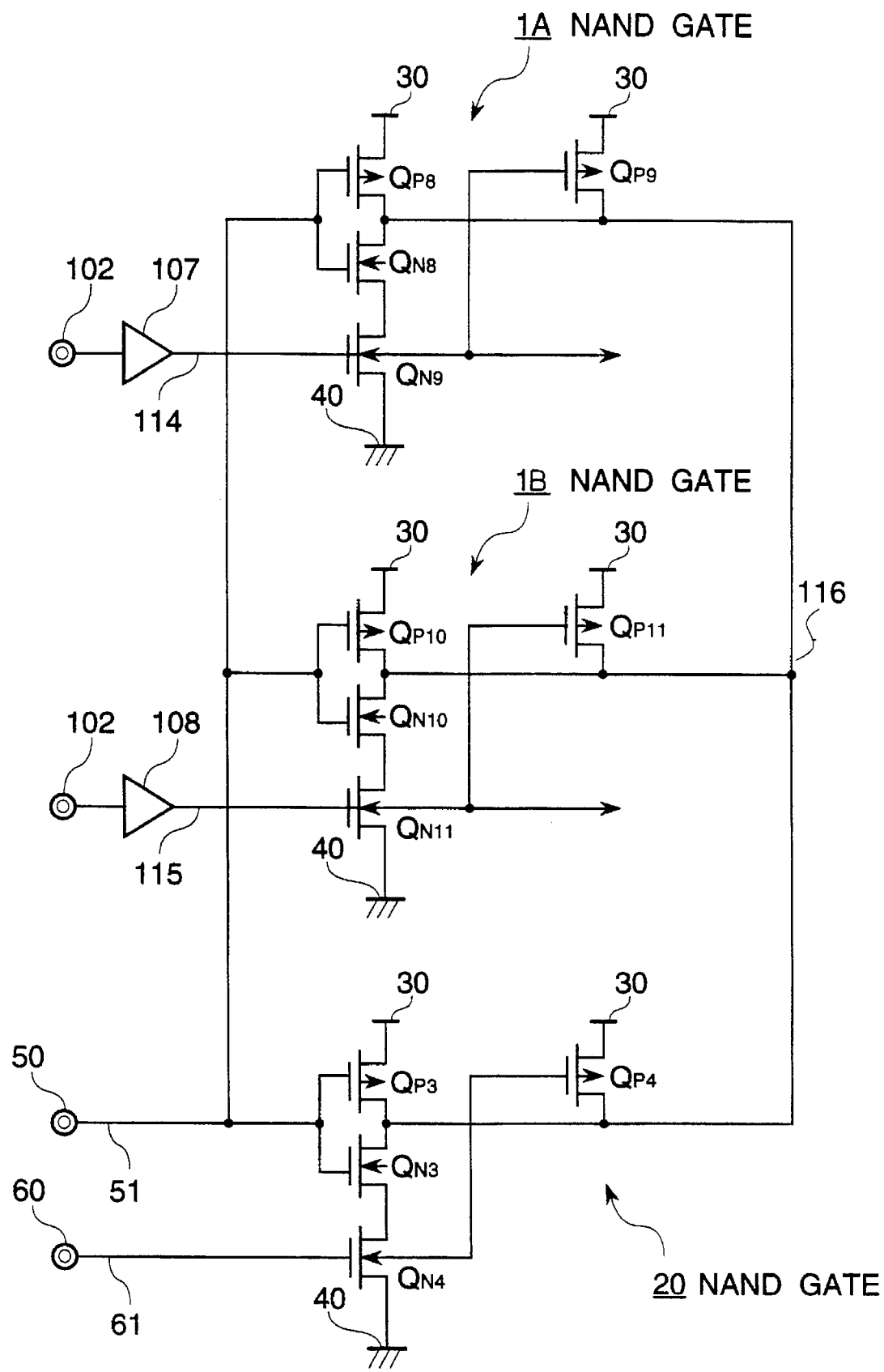
FIG. 12 is a circuit diagram of a fourth embodiment of the input threshold voltage measuring apparatus, on the basis of the first conception of the present invention.

All of the above mentioned first to third embodiments are such that the signal line 116 is directly driven by the inverter of the output stage of the logic gates 1A and 1B. However, the logic gate is not limited to this circuit construction. For example, even if the logic gates 1A and 1B in the circuit shown in FIG. 7 is composed of a NAND gate and the logic gate 20 is also formed of a NAND gate, an advantage similar to that obtained in the above mentioned embodiments can be obtained. FIG. 12 is a circuit diagram, at a transistor level, of a fourth embodiment having such a circuit construction.

Referring to FIG. 12, when the mode setting signal 51 is at the high level, NAND gates 1A and 1B become equivalent to a NOT gate receiving the output signals 114 and 115 of the input buffers 107 and 108, respectively. When the mode setting signal 51 is at the low level, the output signal of each of the NAND gates 1A and 1B is fixed to the high level, regardless of the signals 114 and 115. Namely, the output activation and deactivate of the NAND gates 1A and 1B are both controlled by the mode setting signal 51.

Here, it is assumed that when the mode setting signal 51 is at the high level to perform the input threshold voltage test all the NAND gates 1A, 1B and 20 drive the signal line 116 to the high level, so that no signal collision occurs on the signal line 116. In this case, since nMOS transistors QN9, QN11 and QN4 are off, the current path from the power supply terminal 30 through the signal line 116 to the ground terminal 40 is cut off by these nMOS transistors. On the other hand, assuming that all the NAND gates 1A, 1B and 20 drive the signal line 116 to the low level, since pMOS transistors QP8, QP9, QP10, QP11, QP3 and QP4 are off, the above mentioned current path is cut off by these six transistors.

However, if the NAND 1A drives the signal line 116 to the low level and the other NAND gates 1B and 20 drive the signal line 116 to the high level, a signal collision occurs. In this situation, the nMOS transistors QN8 and QN9 are turned on in the NAND gate 1A, and the pMOS transistors QP11 and QP4 are turned on in the NAND gates 1B and 20. Therefore, a current flows from the power supply terminal 30 of the NAND gates 1B and 20 to the ground terminal 40 of the NAND gate 1A through these turned-on pMOS and nMOS transistors, with the result that the power supply current increases. To the contrary, if the NAND 1A drives the signal line 116 to the high level and the other NAND gates 1B and 20 drive the signal line 116 to the low level, a phenomenon similar to the above mentioned one occurs between the NAND gates, so that the power supply current increases. Namely, a current flows from the pMOS transistor QP9 of the NAND gate 1A which drives the signal line 116 to the high level, to the nMOS transistors QN10, QN11, QN3 and QN4 of the NAND gates 1B and 20 which drive the signal line 116 to the low level, with the result that the power supply current increases.

Figure 13:
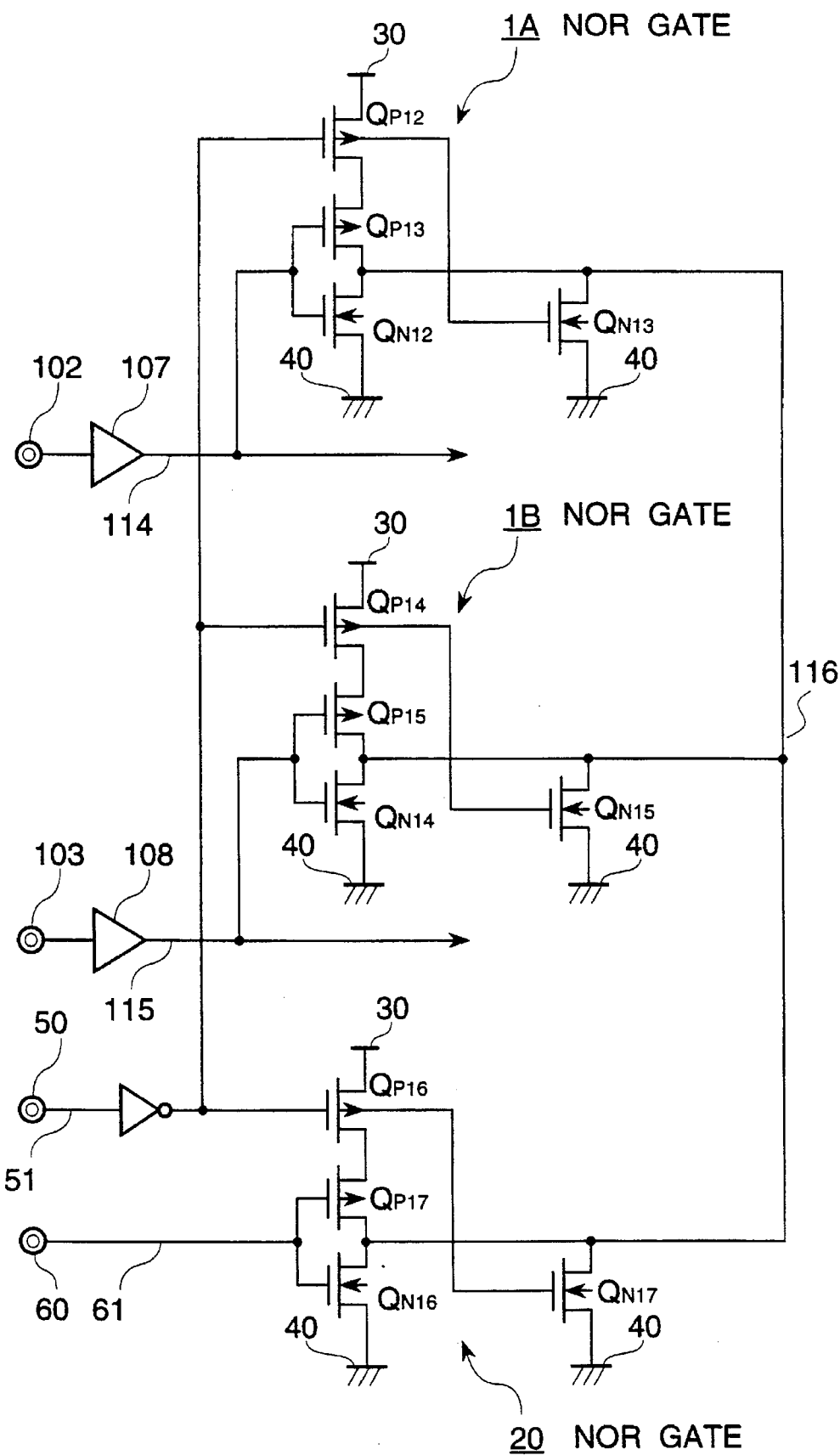
FIG. 13 is a circuit diagram of a fifth embodiment in accordance with the input threshold voltage measuring apparatus on the basis of the first conception of the present invention.

In addition, the logic gates 1A and 1B in the first conceptual embodiment shown in FIG. 7 can be composed of a NOR gate and the logic gate 20 can be formed of a NOR gate, an advantage similar to that obtained in the above mentioned embodiments can be obtained. FIG. 13 is a circuit diagram, at a transistor level, of a fifth embodiment having such a circuit construction.

When one input of a two-input NOR gate is at the low level, the two-input NOR gate becomes equivalent to a NOT gate receiving and inverting an input signal applied to the other input of the two-input NOR gate. However, when the one input of a two-input NOR gate is at the high level, the output signal of the NOR gate is fixed to the low level, regardless of the input signal applied to the other input of the two-input NOR gate. Namely, the output activation and deactivate of a plurality of NOR gates can be controlled together by one common signal. In this embodiment, as shown in FIG. 13, an inverted signal of the node setting signal 51 is applied to the NOR gates 1A, 1B and 20. Accordingly, if the mode setting signal 51 is brought to the high level to indicate the execution of the input threshold voltage test, the output of all the NOR gates 1A, 1B and 20 is activated. In this condition, it is assumed that all the three logic gates 1A, 1B and 20 drive the signal line 116 to the high level, so that no signal collision occurs on the signal line 116. In this case, since six nMOS transistors QN12, QN13, QN14, QN15, QN16 and QN17 are off, the current path from the power supply terminal 30 through the signal line 116 to the ground terminal 40 is cut off by these six nMOS transistors. Therefore, the power supply current does not increase. On the other hand, it is assumed that all the three NOR gates drive the signal line 116 to the low level, so that no signal collision occurs on the signal line 116. In this case, since three pMOS transistors QP13, QP15 and QP7 are off, the current path from the power supply terminal 30 through the signal line 116 to the ground terminal 40 is cut off by these three pMOS transistors. Therefore, similarly, the power supply current does not increase.

However, it is assumed that the NOR 1A drives the signal line 116 to the high level and the other NOR gates 1B and 20 drive the signal line 116 to the low level, so that a signal collision occurs. In this situation, the pMOS transistors QP12 and QP13 are turned on in the NOR gate 1A, and the nMOS transistors QN14 and QN16 are turned on in the NOR gates 1B and 20. Therefore, a current flows from the power supply terminal 30 of the NOR gate 1A to the ground terminal 40 of the NOR gates 1B and 20 through these turned-on pMOS and nMOS transistors, with the result that the power supply current increases. On the other hand, it is assumes that the NOR 1A drives the signal line 116 to the low level and the other NOR gates 1B and 20 drive the signal line 116 to the high level, a phenomenon similar to the above mentioned one occurs between the NOR gates, so that a signal collision occurs. In this situation, the nMOS transistor QN12 is turned on in the NOR gate 1A, and the pMOS transistors QP14, QP15, QP16 and QP17 are turned on in the NOR gates 1B and 20. Therefore, a current flows from the power supply terminal 30 of the NOR gates 1B and 20 to the ground terminal 40 of the NOR gate 1B through these turned-on pMOS and nMOS transistors, with the result that the power supply current also increases. Thus, it is possible to certainly discriminate the pass and failure of the input threshold voltage test on the basis of whether or not the power supply current has increased.

As mentioned above, when an output of each of a plurality of logic gates in the CMOS transistor structure is connected to a common signal line, if output signals of these logic gates collide with each other on the signal line, a power supply current flows from the power supply terminal of the logic gate which drives the signal line to the high level, to the ground terminal of the logic gate which drives the signal line to the low level, with the result that the power supply current increases. The increased amount of the power supply current is not smaller that 1000 times the current when no signal collision occurs. Therefore, it is possible to certainly detect the increase of the power supply current. This first conceptual embodiment is so constructed to utilize this phenomenon. Namely, whether or not respective input buffers outputs an expected logic signal when the same level signal is applied to all the input buffers, is accurately discriminated on the basis of whether or not a signal collision occurs on the common signal line, namely whether or not the power supply current has increased.

Figure 14:
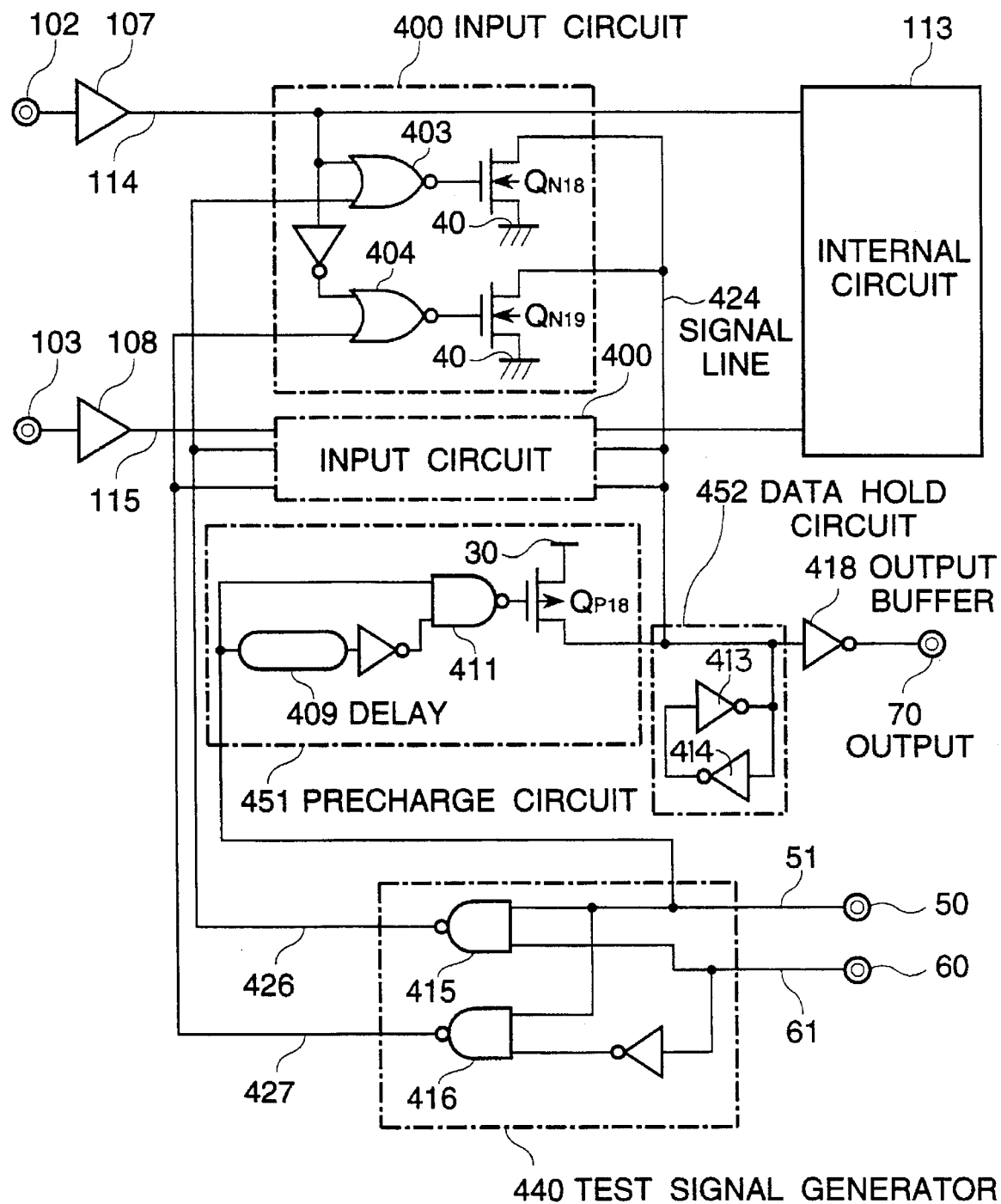
FIG. 14 is a circuit diagram of a sixth embodiment of the input threshold voltage measuring apparatus, on the basis of the second conception of the present invention.

Now, a second conceptual embodiment of the present invention will be described. The first conceptual embodiment explained above can be said to be of a static type, since whether or not the input threshold voltage of the input buffers fulfills the standardized value, is converted into whether or not the power supply current has increased. To the contrary, the second conceptual embodiment can be said to be of a dynamic type, since whether or not the input threshold voltage of the input buffers fulfills the standardized value, is discriminated on the basis of whether or not a data change occurs on a signal line which has been previously charged or discharged to set data. For this purpose, the second conceptual embodiment comprises a monitor signal line, the voltage on which can be read out to an external output terminal, a precharge circuit for previously charging or discharging the monitor signal line for a predetermined period of time, and a switch for discharging or charging the monitor signal line in accordance with an output signal of an input buffer. FIG. 14 is a circuit diagram of one example of the second conceptual embodiment (called a "sixth embodiment" hereinafter).

Referring to FIG. 14, in the embodiment, input buffers 107 and 108 are buffers under test. The input buffer 107 receives an input signal applied to an input terminal 102 from an external source, and outputs an output signal 114 having the same phase as that of the input signal, to an internal circuit 113 of a CMOS transistor structure. This signal 114 causes the internal circuit to perform a signal processing operation. Similarly, the input buffer 108 receives an input signal applied to an input terminal 103, and transfers it to the internal circuit 113. The above mentioned structure is the same as that of a conventional LSI.

The shown embodiment further includes a voltage monitor signal line 424, a precharge circuit 451 for charging the voltage monitor signal line 424 for a predetermined period of time, an input circuit 400 for discharging the charged voltage monitor signal line 424 in accordance with an output signal of the input buffer 107, and a test signal generator 440 for controlling in bundle an activation/reactivation of a plurality of input circuits 400 in accordance with an external control signal (the mode setting signal 51 and the condition setting signal 61), and for changing between the V$_{IL}$ test and the V$_{IH}$ test.

To the monitor signal line 424, a data hold circuit 452 is connected to hold data appearing on this voltage monitor signal line. This data hold circuit 452 is composed of two inverters 413 and 414 connected in such a manner that an input and an output of one of the inverters is connected to an output and an input of the other inverter, respectively. The data on the monitor signal line 424 is current-amplified by an output buffer 418 and outputted through an output terminal 70 to an external output terminal.

The precharge circuit 451 is constructed to charge the monitor signal line 424 to the power supply voltage V$_{DD}$ by on-off controlling a pMOS transistor QP18 connected between the power supply terminal 30 and the monitor signal line 424. The on-off of the transistor QP18 is determined by an output level of a two-input NAND gate 411. This NAND gate 411 has one input connected to receive the mode setting signal 51 applied to the input terminal 50 and the other input connected to receive a signal obtained by delaying the mode setting signal 51 by means of a delay element 409 and by inverting the delayed signal by means of an inverter.

The input circuit 400 includes two nMOS transistors QN18 and QN19 connected between the monitor signal line 424 and the ground terminal 40, and two NOR gates 403 and 404 for respectively on-off controlling these transistors on the basis of the output logic value of the input buffer 107. The NOR gate 403 determining the on-off of the nMOS transistor QN18 receives a signal 426 generated by the test signal generator 440 and the output signal 114 of the input buffer 107. The NOR gate 404 determining the on-off of the nMOS transistor QN19 receives a signal 427 generated by the test signal generator 440 and an inverted signal of the output signal 114. A similar input circuit is provided between the other input buffer 108 and the monitor signal line 424.

The test signal generator 440 includes a two-input NAND gate 415 receiving the mode setting signal 51 applied to the input terminal 50 and the condition setting signal 61 applied to the input terminal 60, for generating their NAND logic signal 426, and another two-input NAND gate 416 receiving the mode setting signal 51 and an inverted signal of the condition setting signal 61, for generating their NAND logic signal 427.

Now, the method for performing the input threshold voltage test in this embodiment and the operation of the circuits in this case will be described with reference to FIGS. 15A and 15B, which are timing charts illustrating a voltage waveform when the embodiment operates.

Referring to the drawings, first, in the V$_{IH}$ test, the standardized voltage VstdH of the high level input threshold voltage is applied to the input terminals 102 and 103. In this condition, the mode setting signal 51 applied to the input terminal 50 is brought from the low level to the high level in order to switch from the normal mode to the test mode.

Figure 15A:
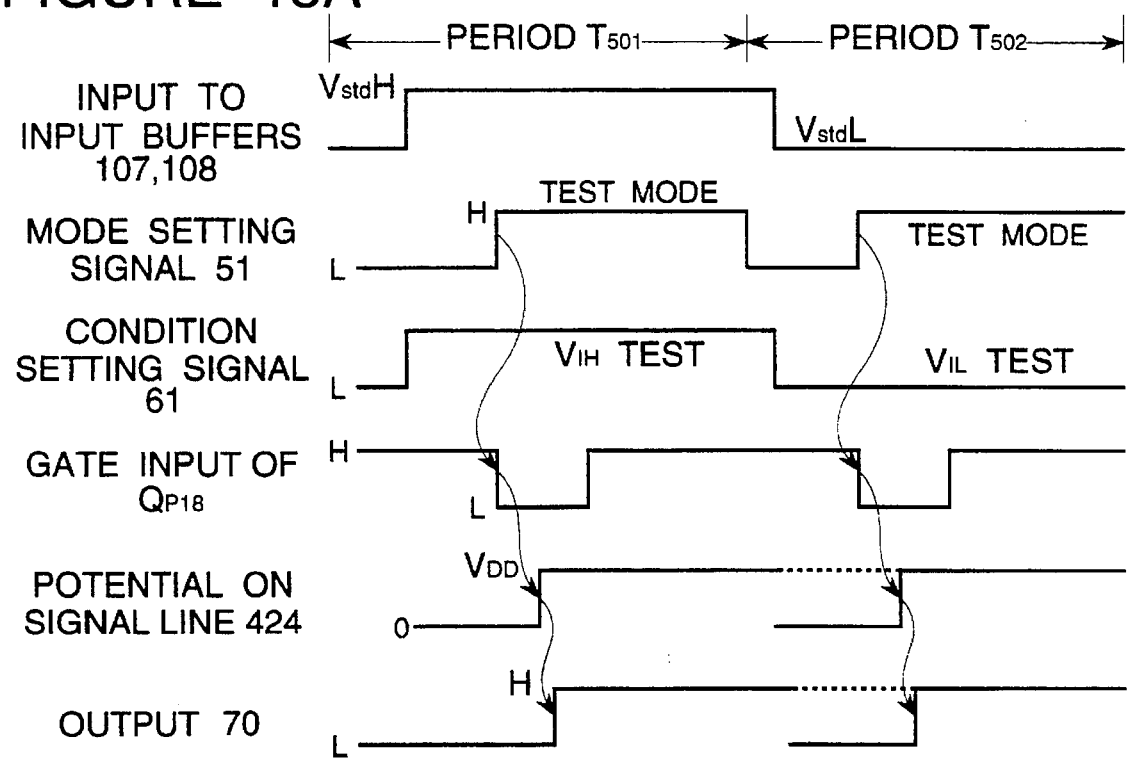
FIGS. 15A and 15B are timing charts illustrating voltage waveforms in operation of the input threshold voltage measuring apparatus shown in FIG. 14.

In addition, the condition setting signal 61 applied to the input terminal 60 is brought to the high level so as to indicate execution of the $V_{IH}$ test (period $T_{501}$ in FIG. 15A). Thus, the NAND gate 415 brings the signal 426 to the low level, and the NAND gate 416 brings the signal 427 to the high level.

In this condition, the NOR gate 403 in the input circuit 400 becomes a NOT gate receiving the output signal 114 of the input buffer 107 as an input signal. On the other hand, since the NOR gate 404 in the input circuit 400 receives the signal 427 of the high level, the NOR gate 404 outputs a low level signal, regardless of the level of the signal applied to the other input of the NOR gate. As a result, the nMOS transistor $Q_{N19}$ is always off.

In addition, in the precharge circuit 451, in response to the change of the mode setting signal 51 to the high level, both the two inputs of the NAND gate 411 are brought to the high level for a period corresponding to a delay time of the delay element 409. As a result, the NAND gate 411 generates a pulse signal of the low level, so that the pMOS transistor $Q_{P18}$ is turned on during only a low level period of the output pulse of the NAND gate 411, so that the monitor signal line 424 is charged to the high level (power supply voltage).

Here, referring to FIG. 15A, when the input buffer 107 passes the $V_{IH}$ test, namely, if the input threshold voltage of the input buffer 107 is lower than the high level standardized voltage VstdH applied to the terminals 102 and 103 and this input buffer operates normally, the output signal 114 is brought to the high level. Therefore, the NOR gate 403 in the input circuit 400 brings the gate input of the nMOS transistor $Q_{N18}$ to the low level, so that this nMOS transistor is maintained in the off condition. Accordingly, the signal line 424 charged to the high level by the pMOS transistor $Q_{P18}$ maintains the high level by action of the data hold circuit 452, even after the charging made by the transistor $Q_{P18}$ is terminated. Thus, the output buffer 418 outputs the signal 424 of the high level through the output terminal 419 to the external circuit. This signal 424 is discrimination data.

Next, operation of the $V_{IL}$ test (period $T_{502}$ in FIG. 15A) will be described. In the case of performing the $V_{IL}$ test continuously from the $V_{IH}$ test, the mode setting signal 51 is brought to the low level once, and then, the condition setting signal 61 is brought to the low level. Furthermore, the standardized voltage VstdL of the low level input threshold voltage is applied to the input terminals 102 and 103. Thereafter, the mode setting signal 51 is brought to the high level, again, so as to execute the $V_{IL}$ test.

In this condition, similarly to the $V_{IH}$ test, the precharge circuit 451 charges the monitor signal line 424 to the high level only during the period corresponding to the delay time of the delay element 409. In this case, if the result of the $V_{IH}$ test in the preceding cycle $T_{501}$ is "pass", the level of the signal line 424 continues to be maintained at the high level as shown by a dotted line in FIG. 15A.

Here, in the test signal generator 440, the signal 426 of the NAND gate 415 is brought to the high level in response to the change of the condition setting signal 61 to the high level. This high level signal 426 brings the output of the NOR gate 403 to the low level, regardless of the output signal 114 of the input buffer 107, and therefore, the nMOS transistor $Q_{N18}$ is always off. On the other hand, the NAND gate 416 outputs the signal 427 of the low level. As a result, because of this low level signal 427, the NOR gate 414 of the input circuit 400 becomes equivalent to a NOT gate receiving the inverted signal of the output signal of the input buffer 107 as an input signal.

In this condition, it is assumed that the input buffer 107 passes the $V_{IL}$ test, namely, that the input threshold voltage of the input buffer 107 is higher than the standardized voltage VstdL applied to the terminals 102 and 103 and this input buffer operates normally. Referring to FIG. 15A, the output signal 114 is brought to the low level in this situation. Therefore, the NOR gate 404 receives the high level signal obtained by inverting this low level signal 114, and brings the gate input of the nMOS transistor $Q_{N19}$ to the low level, so that this nMOS transistor is maintained in the off condition. Accordingly, similarly to the $V_{IH}$ test, the signal line 424 charged to the high level by the pMOS transistor $Q_{P18}$ maintains its potential level. A discrimination result of this high level is outputted through the output buffer 418 to the output terminal 70.

The above mentioned explanation of the operation is in the case that the input buffer passes the $V_{IH}$ test and the $V_{IL}$ test. Next, operation when the input buffer fails the test, will be described with reference to FIG. 15B illustrating voltage waveforms in this case.

First, examine that the input buffer 107 does not fulfil the standardized voltage VstdH of the high level input threshold voltage in the $V_{IH}$ test during a period $T_{503}$, (namely, the input threshold voltage of the input buffer 107 is higher than the standardized voltage VstdH). In this case, the standardized voltage VstdH is applied to all input buffers under test. As a result, the input buffer 107 malfunctions, and brings the signal 114 to the low level. Here, since both the mode setting signal 51 and the condition setting signal 61 are brought to the high level so that the signals 426 and 427 are brought to the low level and the high level, respectively, the NOR gate 403 of the input circuit 400 brings the gate input of the nMOS transistor $Q_{N18}$ to the high level. As a result, this nMOS transistor $Q_{N18}$ is turned on, so that the signal line 424 continues to be driven to the ground level (the low level). Incidentally, the NOR gate 404 and the nMOS transistor $Q_{N19}$ on-off controlled by the output signal of the NOR gate 404 operate similarly to the case that the input buffer passes the $V_{IH}$ test as mentioned above, and therefore, the nMOS transistor $Q_{N19}$ is maintained in the off condition.

On the other hand, in the precharge circuit 451, the pMOS transistor $Q_{P18}$ attempts to charge the signal line 424 to the high level during the period corresponding to the delay time of the delay element 409. In this case, however, as mentioned above, since the nMOS transistor $Q_{N18}$ of the input circuit 400 attempts to drive the signal line 424 to the low level, the potential of the signal line 424 becomes an intermediate potential. Thereafter, when the charge of the signal line 424 to the high level by action of the precharge circuit 451 is terminated, the pMOS transistor $Q_{P18}$ is turned off, but the pMOS transistor $Q_{N18}$ continues to drive the signal line 424 to the low level. As a result, the signal line 424 finally becomes the low level. Thus, the low level signal, which is the discrimination data, is outputted through the output buffer 418 to the output terminal 70.

The above mentioned description relates to the case that only the input buffer 107 fails the $V_{IH}$ test. However, when another input buffer fails the test, or when a plurality of input buffers simultaneously fail the test, if at least one of nMOS transistors corresponding to the nMOS transistor $Q_{N18}$ in the input circuit 400 is turned on, namely, at least one input buffer malfunctions, the signal line 424 is driven to the low level, so that the low level signal is outputted through output terminal 419.

Figure 15B:
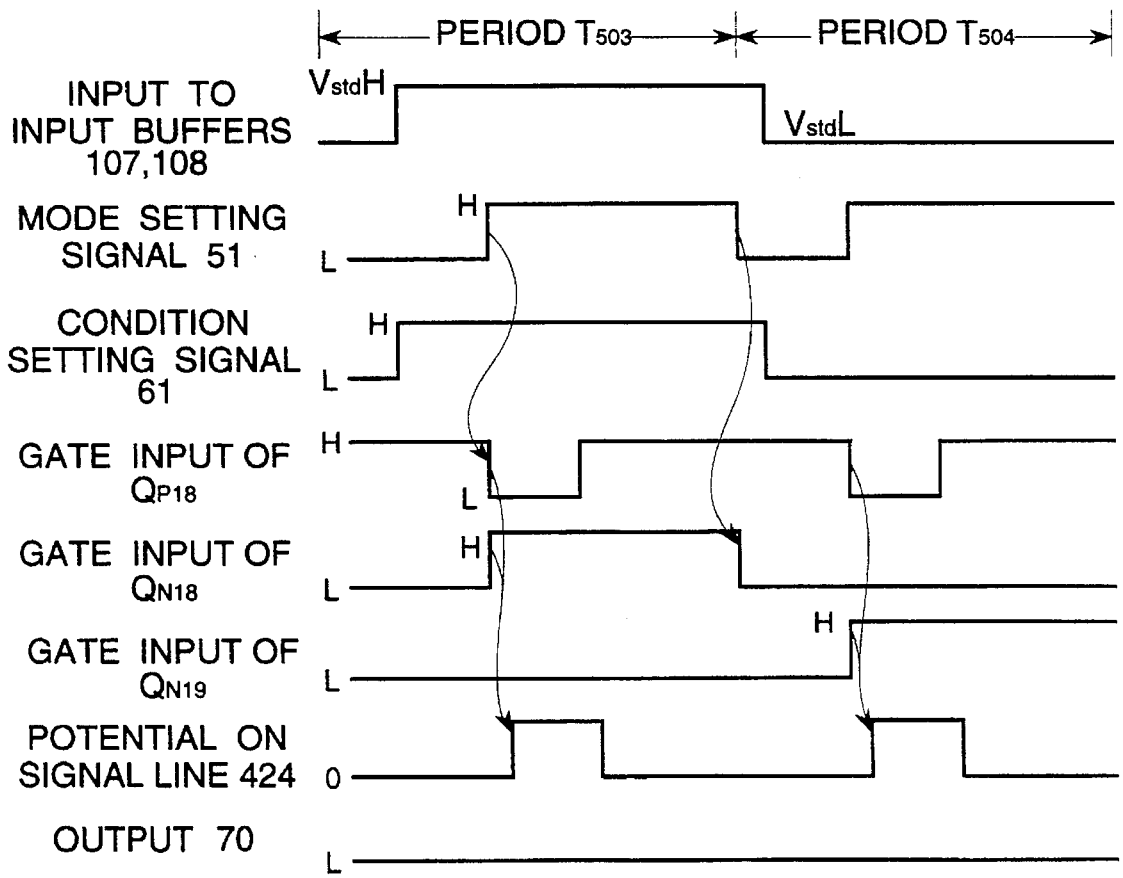

Next, examine that the input buffer 107 fails the $V_{IL}$ test during a period $T_{504}$ as shown in FIG. 15B (namely, the input threshold voltage of the input buffer 107 is lower than the standardized voltage VstdH of the low level input threshold voltage). In this case, the standardized voltage VstdL is applied to the input terminals 102 and 103. The input buffer 107 malfunctions, and brings the signal 114 to the high level. This high level signal 114 is inverted by the inverter to the low level signal, which is supplied to one input of the NOR gate 404 of the input circuit 400. On the other hand, the mode setting signal 51 is brought from the low level to the high level, and the condition setting signal 61 is brought from the high level to the low level, so that the signals 426 and 427 are brought to the high level and the low level, respectively. Accordingly, both the two input signals of the NOR gate 404 are brought to the low level, the NOR gate 404 brings the gate input of the nMOS transistor QN19 to the high level. As a result, the nMOS transistor QN19 in the input circuit 404 is turned on, so that the signal line 424 is driven to the ground level (the low level). The succeeding operation is similar to the operation during the period T503, the low level signal on the signal line 424, which is the result of discrimination, is outputted through the output buffer 418 to the output terminal 70.

Figure 1A:
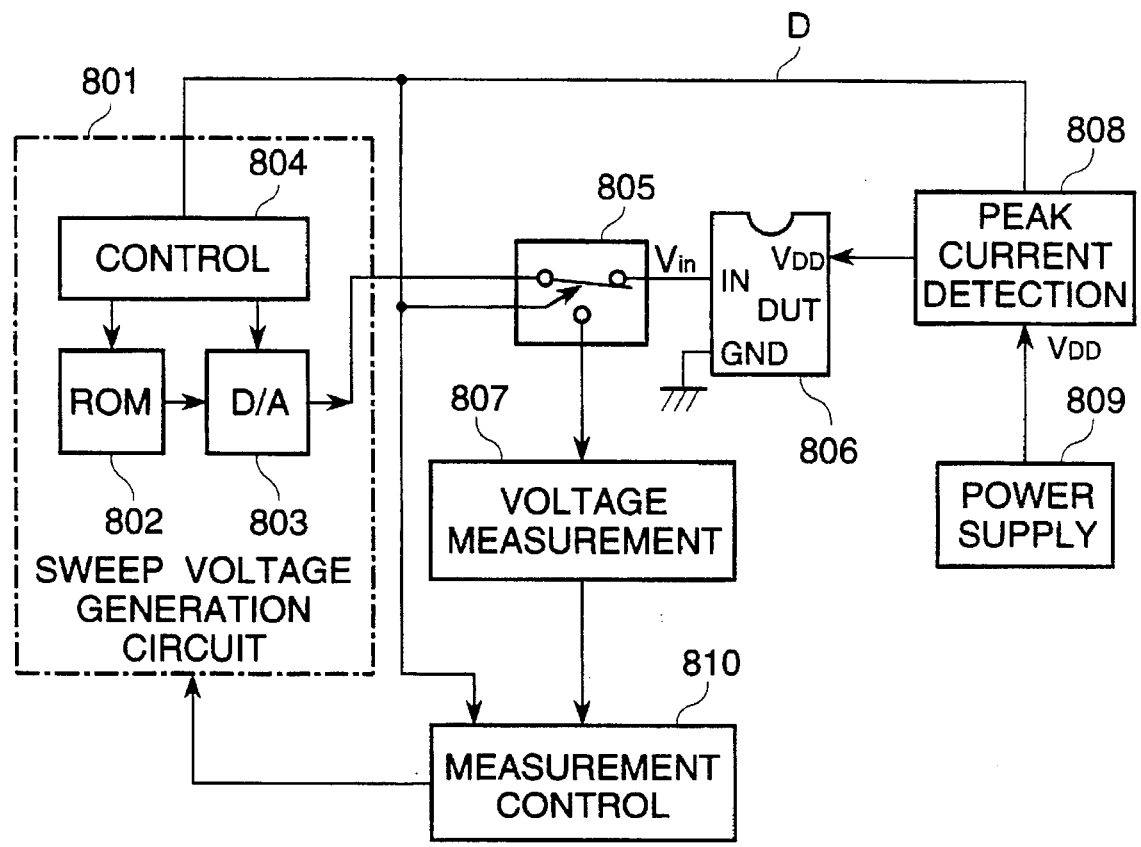
FIG. 1A is a block diagram of the input threshold voltage measuring apparatus of the first prior art.
Figure 1B:
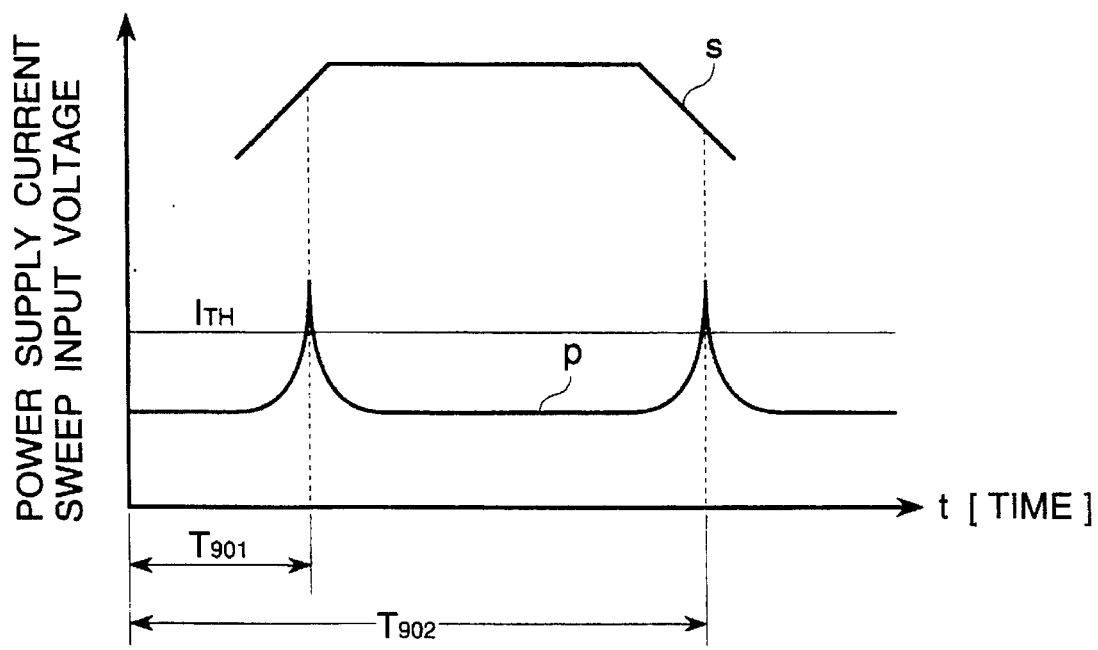
FIG. 1B illustrates an operation waveform in the input threshold voltage measuring apparatus shown in FIG. 1A at the time of the measurement.
Figure 2A:
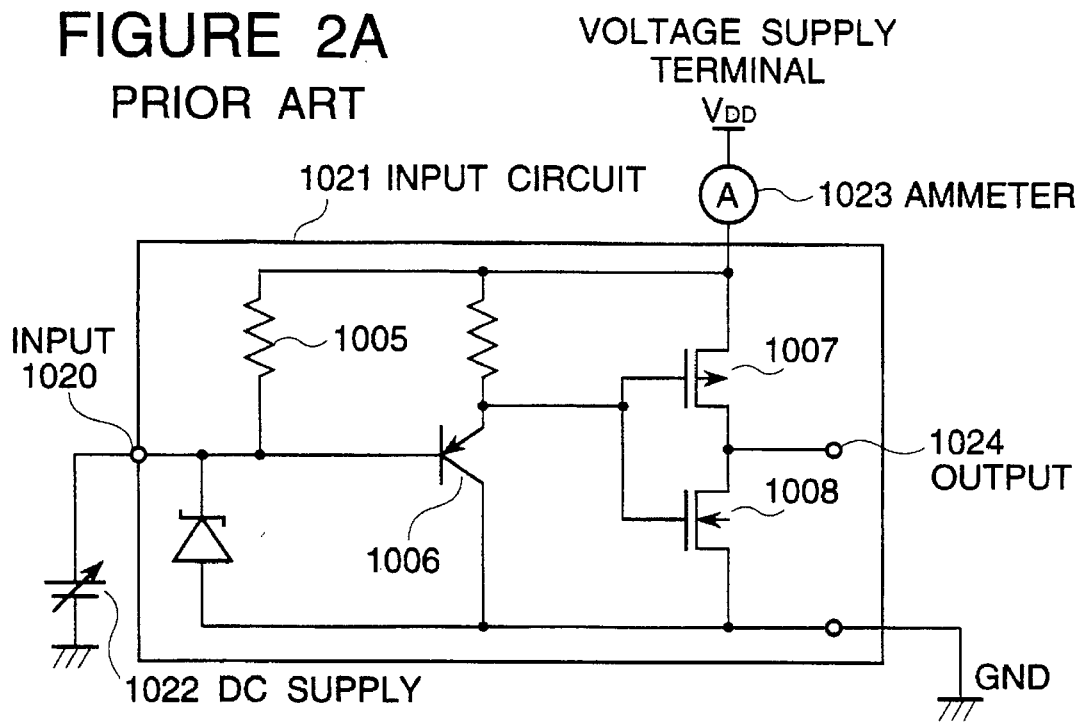
FIG. 2A is a circuit diagram of an input circuit of a Bi-CMOS LSI, which realizes the input threshold voltage measuring apparatus of the second prior art.
Figure 2B:
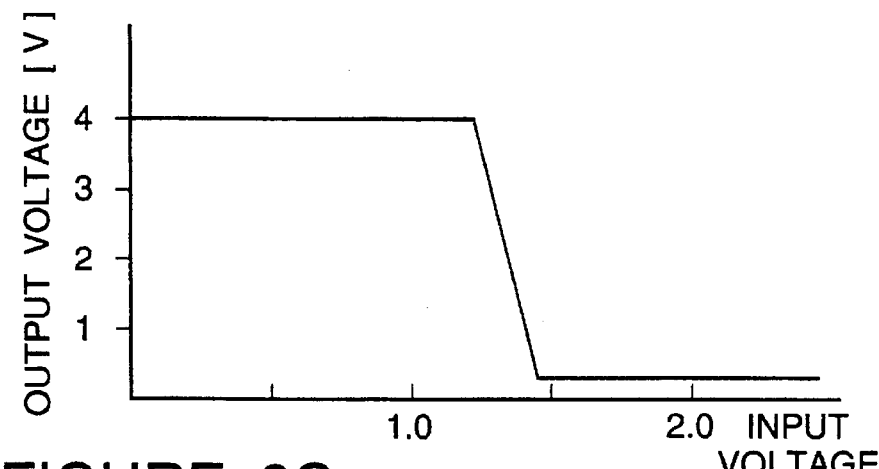
FIGS. 2B and 2C illustrate an operation waveform in the input threshold voltage measuring apparatus shown in FIG. 2A at the time of the measurement.
Figure 2C:
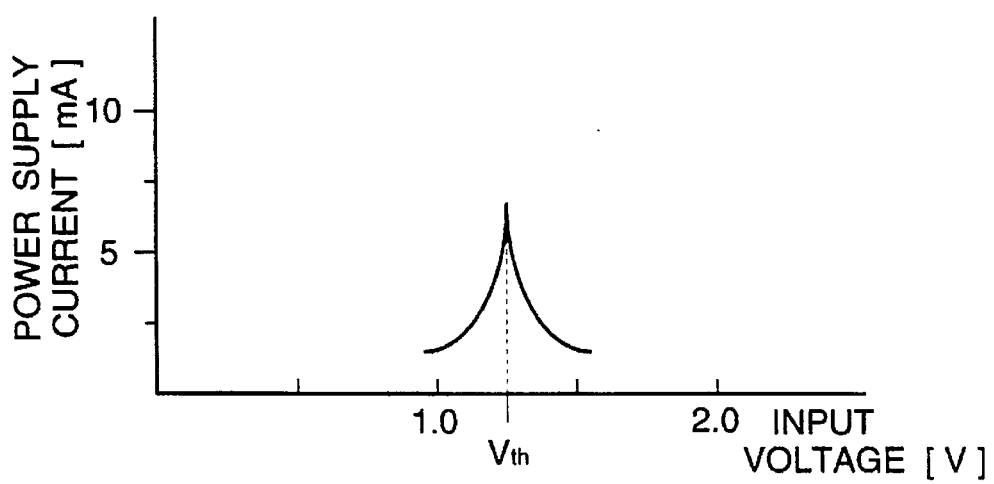
Figure 3A:
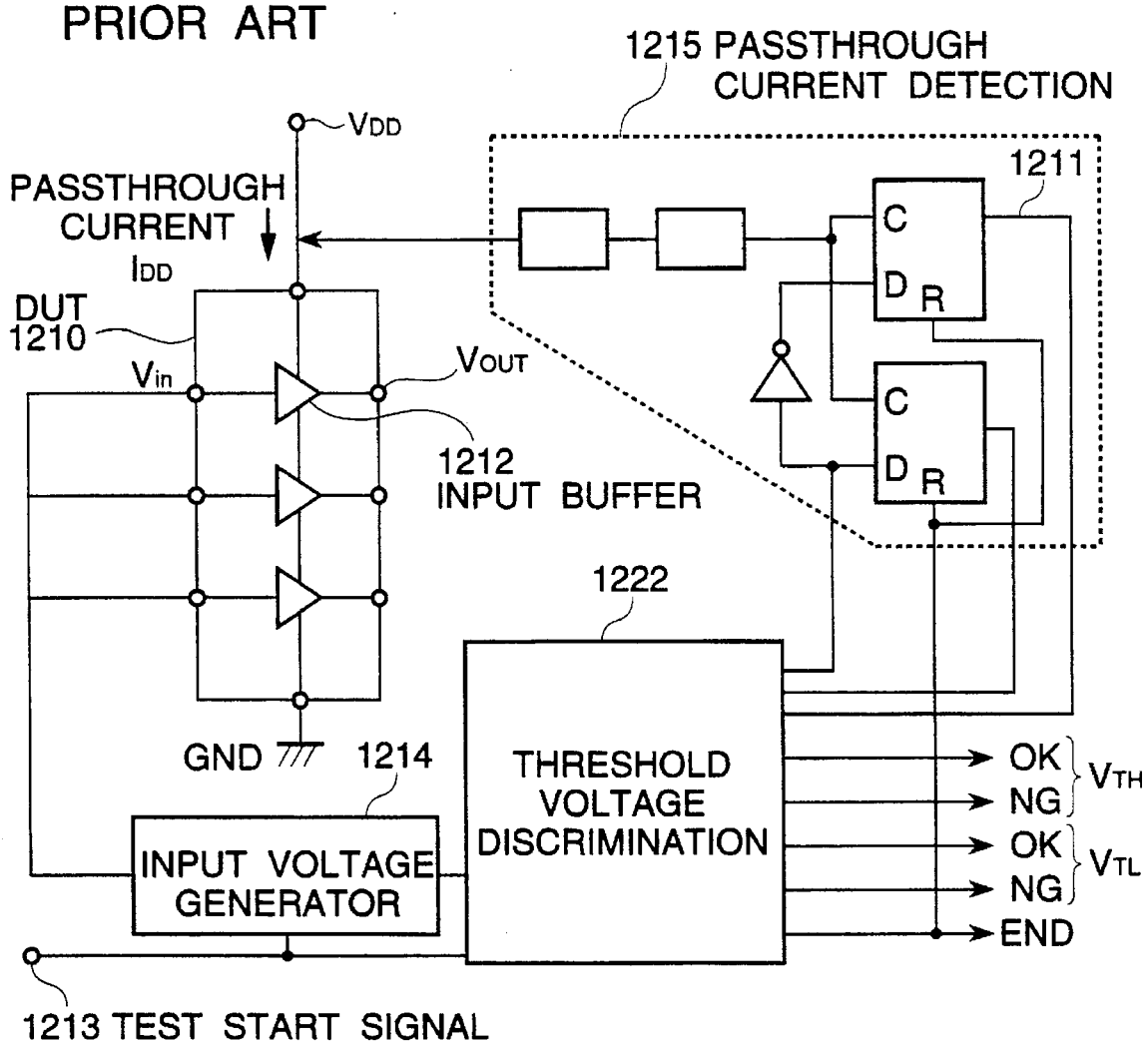
FIG. 3A is a block diagram of the input threshold voltage measuring apparatus of the third prior art.
Figure 3B:
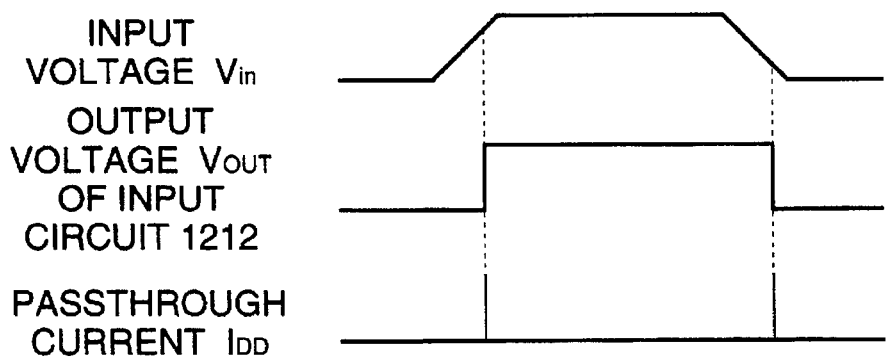
FIG. 3B illustrates an operation waveform in the input threshold voltage measuring apparatus shown in FIG. 3A at the time of the measurement.
Figure 4A:
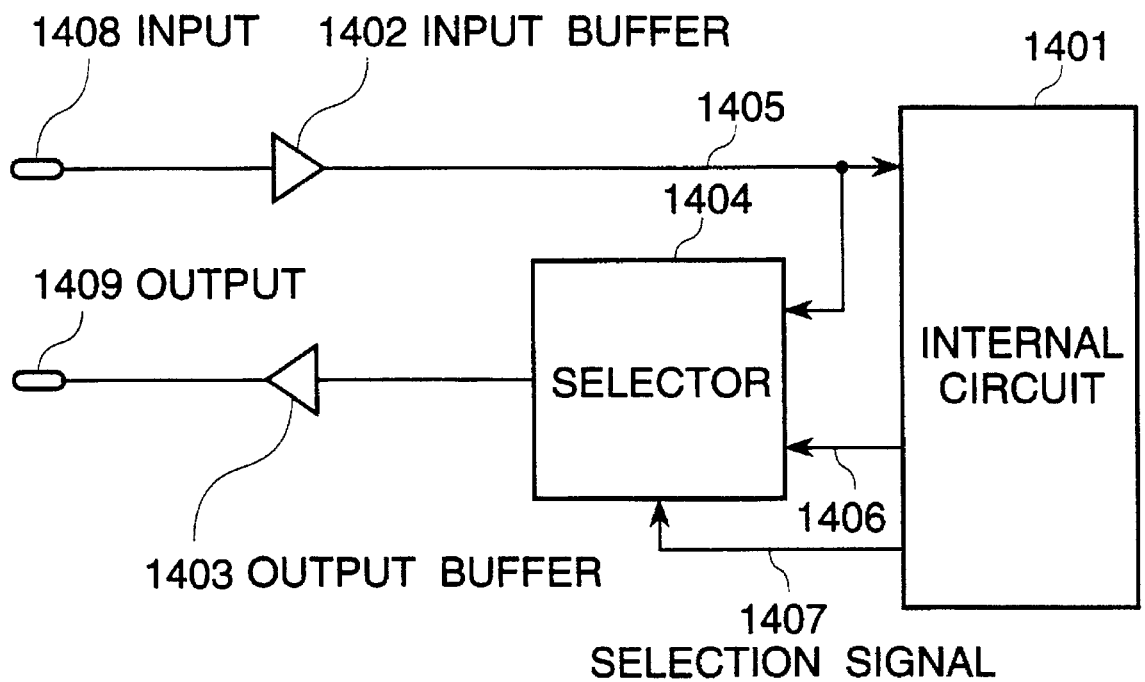
FIG. 4A is a block diagram of the input threshold voltage measuring apparatus of the fourth prior art.
Figure 4B:
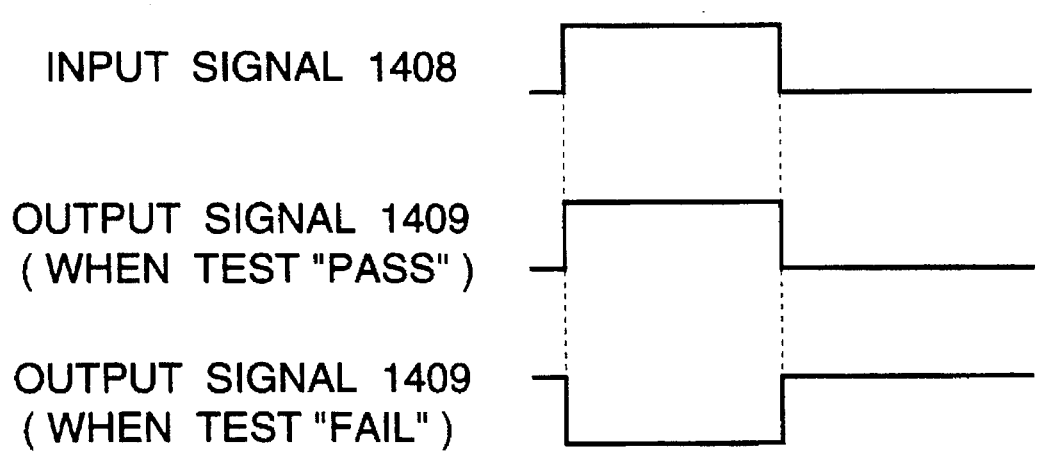
FIG. 4B illustrates an operation waveform in the input threshold voltage measuring apparatus shown in FIG. 4A at the time of the measurement.
Figure 5A:
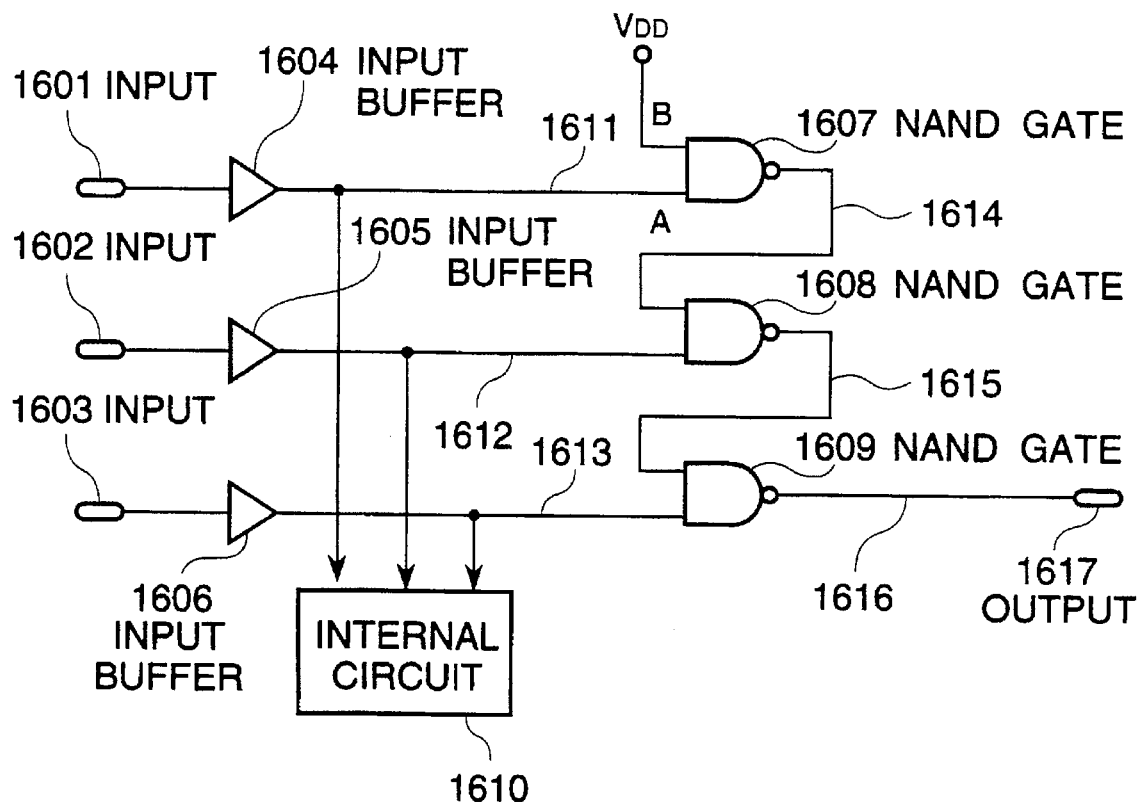
FIG. 5A is a block diagram of the input threshold voltage measuring apparatus of the fifth prior art.
Figure 5B:
FIG. 5B illustrates an operation waveform in the input threshold voltage measuring apparatus shown in FIG. 5A at the time of the measurement.
Figure 6A:
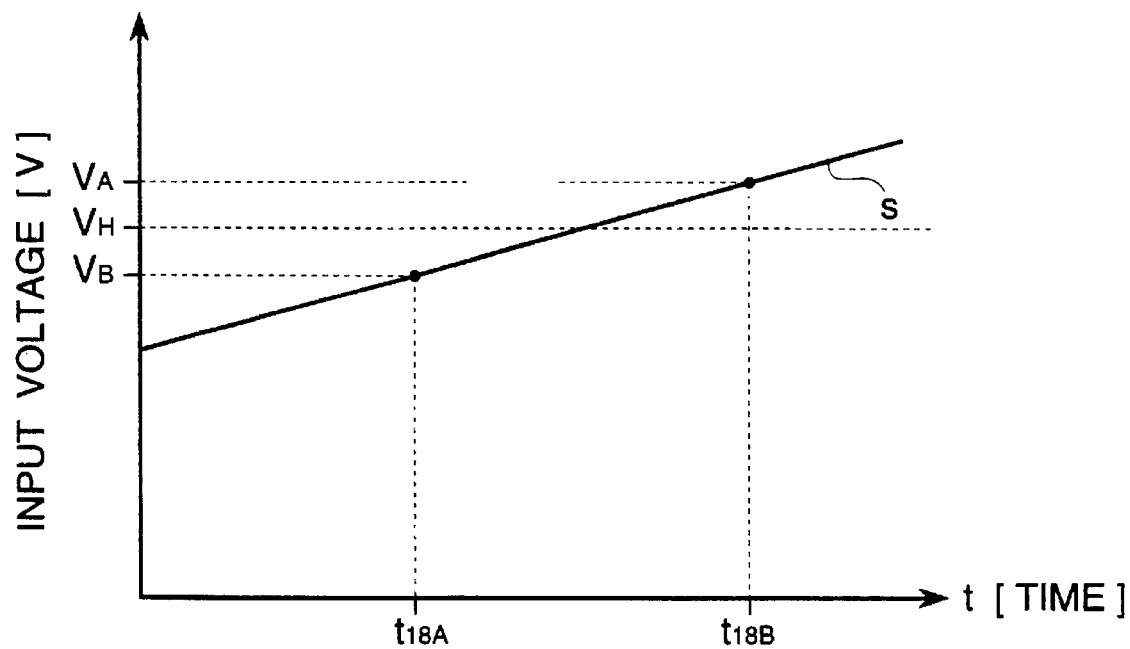
FIGS. 6A and 6B are graphs illustrating a problem in input threshold voltage measuring apparatus of the first to third prior arts.
Figure 6B:
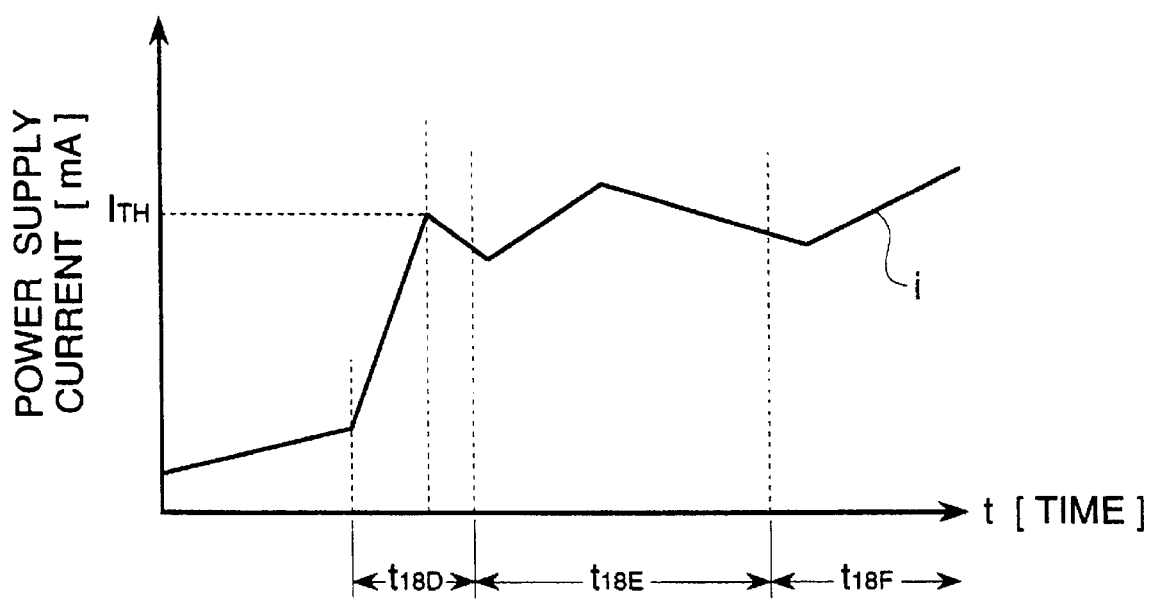

As mentioned above, in this embodiment, if the input buffer passes the test regardless of which is the test, the VIH test or the VIL test, namely, if all the input buffers fulfil the standardized voltage, the discrimination output signal is maintained at the high level. However, if the input buffer fails the test, the discrimination output signal flips to the low level. In this case, furthermore, differently from the fifth prior art shown in FIG. 5, the logic level of the discrimination output signal indicating the "pass" and the "failure" is directly and unambiguously determined by only the "pass" and the "failure", without being influenced by a testing condition, such as the number of input buffers, or whether the test is the VIH test or the VIL test. As mentioned above, this embodiment is so constructed to observe externally the level of the discrimination output signal outputted from the output terminal 70. Specifically, it is possible to easily execute the input threshold voltage test, by using, for example, a function test function provided in an LSI tester.

Incidentally, because the shown embodiment is of the dynamic type, the data hold circuit 452 connected to the monitor signal line 424 is provided to certainly hold the data on the signal line 424 for a long time. However, as will be apparent from the above description, even if the data hold circuit 452 is not provided, the advantage of the shown embodiment is not lost at all. In addition, the external output terminal 419 and the output buffer 418 are a terminal and a buffer which are exclusively provided for the input threshold voltage test, but an output buffer and an external output terminal used in a conventional signal processing operation of the LSI can be used as the output buffer 418 and the external output terminal 419. In this case, for example, before the output buffer there is located a selector which receives the discrimination result signal from the monitor signal line 424 as a signal to be selected, and which is controlled to select the signal from the monitor signal line 424 when the mode setting signal 51 is at the high level.

Figure 16:
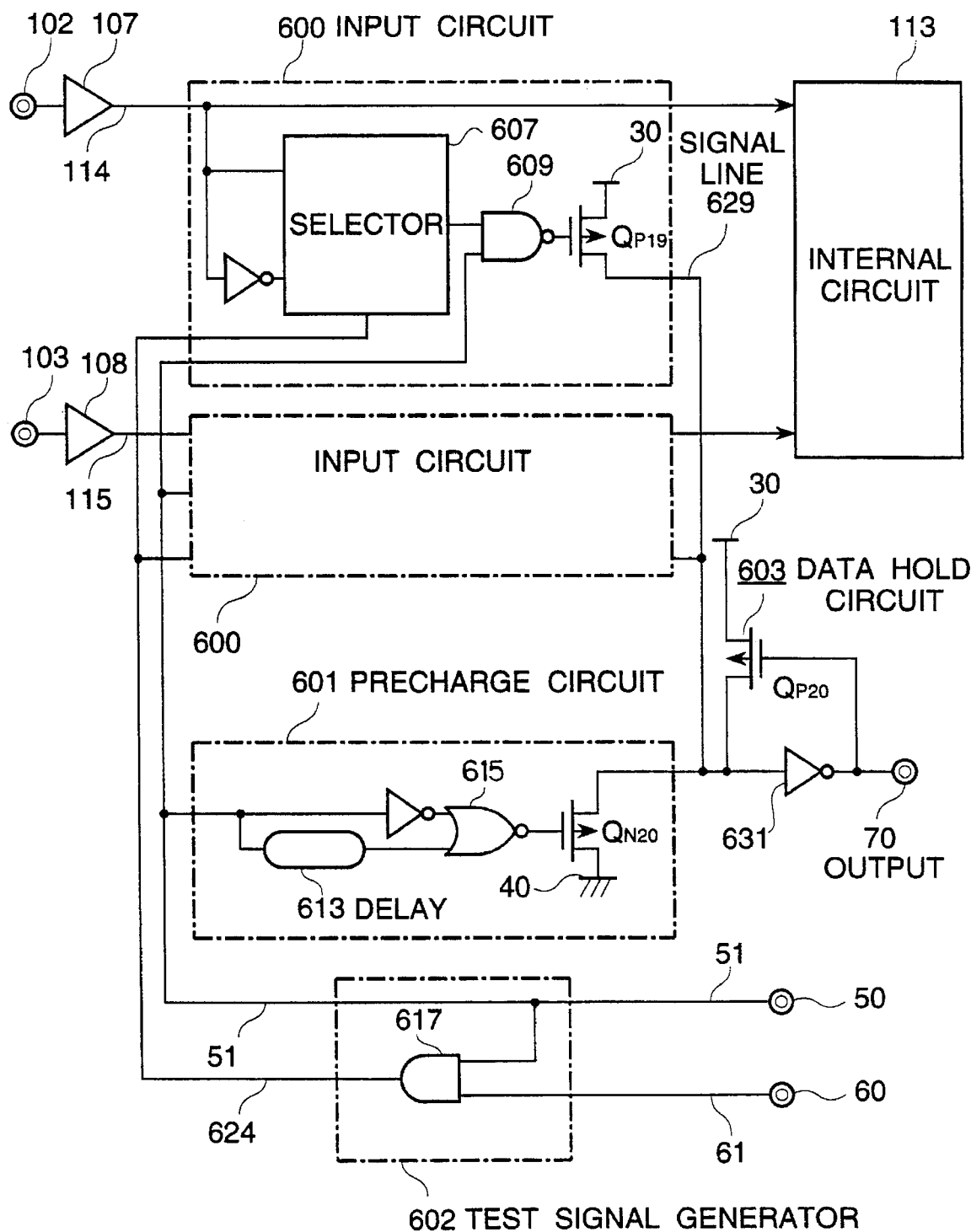
FIG. 16 is a circuit diagram of a seventh embodiment of the input threshold voltage measuring apparatus, on the basis of the second conception of the present invention.

The above mentioned fifth embodiment is so constructed that the monitor signal line is previously charged to the power supply voltage VDD by the precharge circuit, and is discharged when the input buffer fails the threshold voltage test. To the contrary, it is possible to construct to the effect that the monitor signal line is previously discharged to the ground potential, and whether the input buffer passes or fails the threshold voltage test is discriminated on the basis of whether or not the discharged signal line is charged. FIG. 16 is a circuit diagram of another embodiment which is so configured to realize the above construction and which is based on the second conception. This embodiment will be called a "seventh embodiment".

Referring to FIG. 16, this embodiment includes, in addition to the input buffers under test and the internal circuit 113 receiving the signal from the input buffers for performing the conventional signal processing, a monitor signal line 629, a precharge circuit 601 for previously discharging the signal line 629 to the ground potential, an input circuit 600 for charging the discharged signal line 629 to the power supply potential in accordance with the signal from the input buffer, and a test signal generator 602 for controlling an activation/deactivation of a plurality of input circuits 600 in accordance with an external control signal (the mode setting signal 51 applied to the input terminal 50 and the condition setting signal 61 applied to the input terminal 60), and for changing between the VIL test and the VIH test.

The data of the discrimination result appearing on the monitor signal 629 is held in a data hold circuit 603, and simultaneously outputted through an inverter 604 and an output terminal 70 to an external circuit. The data hold circuit 603 is composed of a pMOS transistor QP20 connected between the signal line 629 and the power supply terminal 30 and having a gate connected to receive an output of the inverter 604. The inverter 604 outputs the high logic level when the discrimination result is "pass" and the low logic level when the discrimination result is "failure", so that the output logic level is consistent with that of the sixth embodiment. In addition, the inverter 604 current-amplifies the discrimination output signal in order to output the discrimination output signal to the external output terminal.

The precharge circuit 601 is configured to discharge the signal line 629 to the ground potential by on-off controlling an nMOS transistor QN20 connected between the ground terminal 40 and the monitor signal line 629. The on-off of the transistor QN20 is determined by the output signal level of a two-input NOR gate 615. The NOR gate 615 has one input connected to receive a signal obtained by inverting the mode setting signal 51 applied to the input terminal 50 by an inverter, and the other input receiving a signal obtained by delaying the mode setting signal 51 by a delay element 613.

The input circuit 600 includes a pMOS transistor QP19 connected between the monitor signal line 629 and the power supply terminal 30, a two-input NAND gate 609 having an output connected to a gate of the transistor QP19, and a selector 607 for selecting either the output signal 114 of the input buffer 107 or an inverted signal of the output signal 114 so as to output the selected signal. When a signal 624 generated in the test signal generator 602 is at the low level, the selector 607 selects the signal 114 to supply the signal 114 to the NAND gate 609, and when the signal 624 is at the high level, the selector 607 selects the inverted signal of the signal 114 to supply the inverted signal to the NAND gate 609. Thus, the NAND gate 609 outputs an NAND logic signal between the mode setting signal 51 and the output signal of the selector 607, to the gate of the pMOS transistor QP19. A similar input circuit is connected between the other input buffer 108 and the monitor signal line 629.

The test signal generator 602 is comprises of a two-input AND gate 617 receiving the mode setting signal 51 applied to the input terminal 50 and the condition setting signal 61 applied to the input terminal 60, for outputting their AND logic signal 629.

Figure 17A:
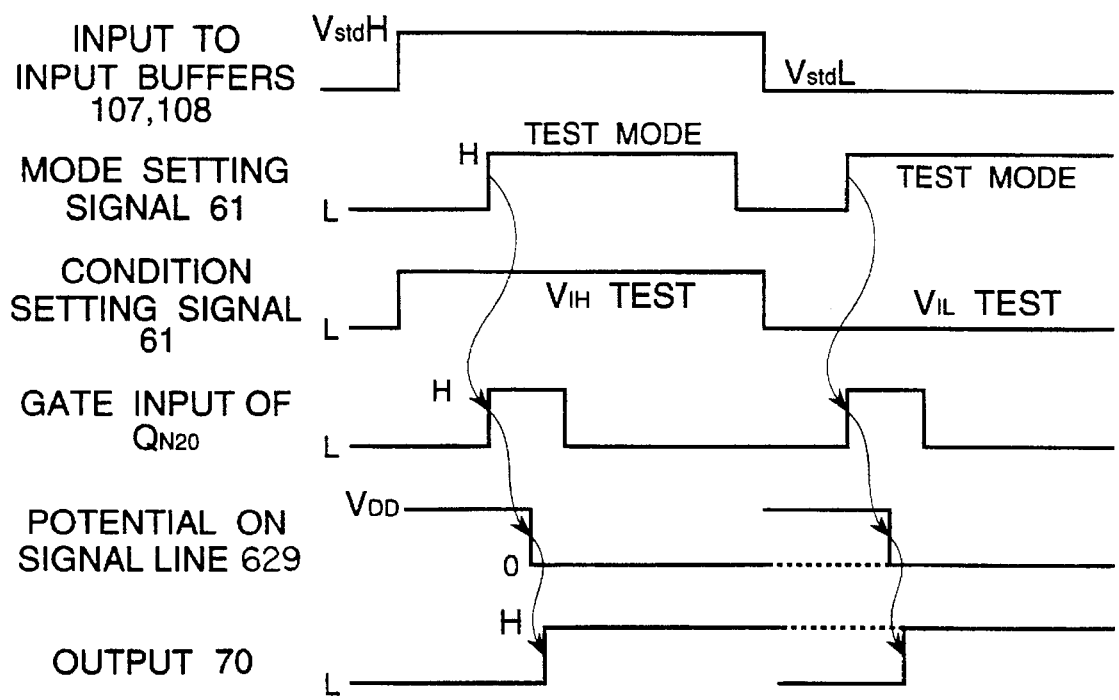
FIGS. 17A and 17B are timing charts illustrating voltage waveforms in operation of the input threshold voltage measuring apparatus shown in FIG. 16.
Figure 17B:
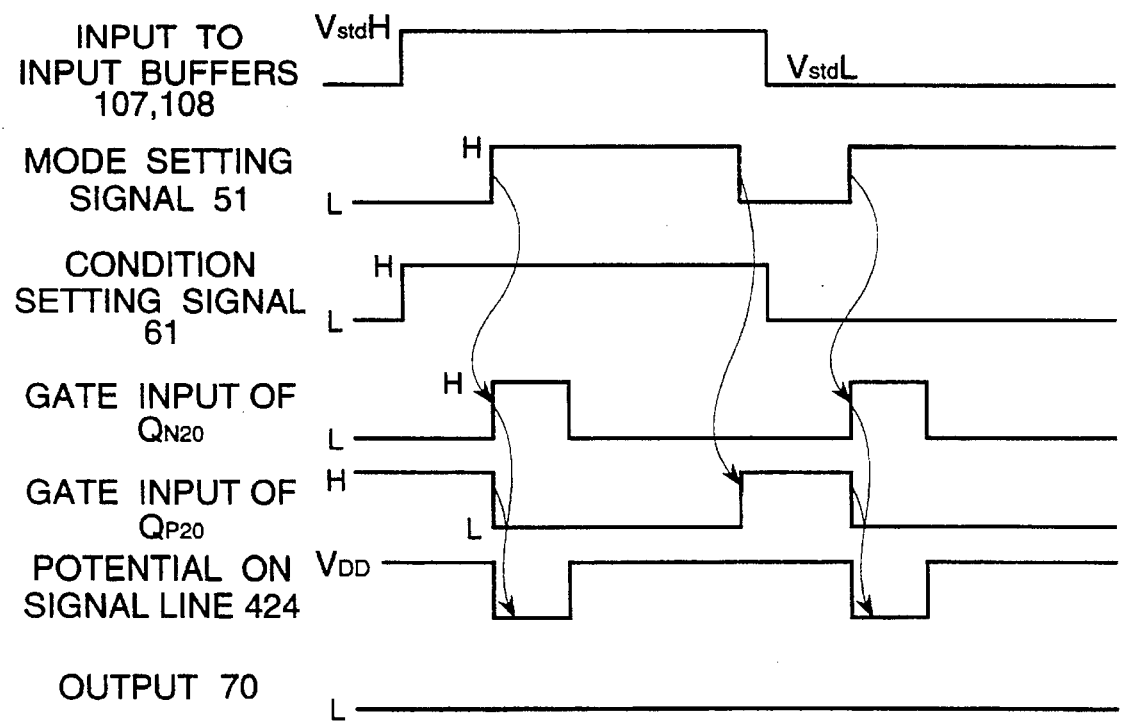

Now, the method for performing the input threshold voltage test in this embodiment and the operation of the circuits in this case will be described with reference to FIGS. 17A and 17B, which are timing charts illustrating a voltage waveform when the embodiment operates. FIG. 17A shows the waveform when the circuit passes the test, and FIG. 17B shows the waveform when the circuit fails the test.

First, in the V$_{IH}$ test, the standardized voltage VstdH of the high level input threshold voltage is applied to the input terminals 102 and 103. Furthermore, the mode setting signal 51 and the condition setting signal 61 are brought to the high level to indicate the start of the V$_{IH}$ test. As a result, the AND gate 617 brings the signal 624 to the high level, and therefore, the selector 607 selects the inverted signal of the output signal 114 of the input buffer 107. On the other hand, since the mode setting signal 51 is at the high level, the one input signal of the NAND gate 609 of the input circuit 600 is brought to the high level, and therefore, the NAND gate 609 becomes a NOT gate receiving the output of the selector 607 as an input signal.

Here, referring to FIG. 17A, when the input buffer 107 operates normally (namely, if the threshold voltage of the input buffer 107 is lower than the standardized voltage VstdH applied to the terminals 102 and 103), the output signal 114 of the input buffer 107 is brought to the high level. Therefore, the output signal of the selector 607 is brought to the low level, and the NAND gate 609 supplies the high level signal to the gate of the nMOS transistor Q$_{P19}$, so that the nMOS transistor Q$_{P19}$ is put into the off condition. Accordingly, a charging path between the power supply terminal 30 and the monitor signal line 629 is cut off.

Simultaneously, in the precharge circuit 601, in response to the change of the mode setting signal 51 to the high level, the NOR gate 615 outputs a high level pulse signal during a period corresponding to a delay time of the delay element 613. In response to the high level pulse signal, the nMOS transistor Q$_{N20}$ is turned on so as to discharge the monitor signal line 629 to the low level (the ground potential).

At this time, if all the input buffers under test pass the V$_{IH}$ test, the signal line 629 is discharged by the nMOS transistor Q$_{N20}$ to the low level, which is held in the pMOS transistor Q$_{P20}$ of the data hold circuit 604. This low level discrimination output signal is inverted by the inverter 631 to the low level, which is outputted from the output terminal 70.

On the other hand, referring to FIG. 17B, when the input buffer fails the V$_{IH}$ test (the input threshold voltage of the input buffer 107 is higher than the standardized voltage VstdH applied to the input terminals 102 and 103), the input buffer 107 outputs the signal 114 of the low level. As mentioned above, since the selector 607 selects the inverted signal of the signal 114, the output signal of the selector 607 is brought to the high level. In response to the high level from the selector and the high level mode setting signal 51, the NAND gate 609 applies the low level signal to the gate of the pMOS transistor Q$_{P19}$, so as to turn on this pMOS transistor Q$_{P19}$. As a result, the potential of the monitor signal line 629 becomes an intermediate value between the power supply potential V$_{DD}$ and the ground potential, but after the discharge made by the precharge circuit 601 is terminated, the monitor signal line 629 is fully charged to power supply potential V$_{DD}$, namely to the high level. This high level discrimination output signal is held in the data hold circuit 604, and inverted by the inverter 601 to the low level, which is outputted through the output terminal 70 to the external circuit. Thus, if at least one of all the input buffers fails the V$_{IH}$ test, the monitor signal line is not sufficiently discharged, and after the discharging, the signal line is charged to the power supply potential, with the result that the low level discrimination output signal indicating "failure" is outputted to the external circuit.

Next, in the V$_{IL}$ test, after the mode setting signal 51 is brought to the low level once, the standardized voltage VstdL of the low level input threshold voltage is applied to the input terminals 102 and 103. Then, the condition setting signal 61 is brought to the low level, and the mode setting signal 51 is brought to the high level, again, so as to execute the V$_{IL}$ test. In this condition, since the AND gate 617 outputs the low level signal 624, the selector 607 selects the output signal 114 of the input buffer 107. On the other hand, since the mode setting signal 51 at the high level, the one input of the NAND gate 609 of the input circuit 600 is brought to the high level, the NAND gate 609 becomes equivalent to a NOT gate receiving the output signal of the selector 607 (namely, the signal 114) as an input signal.

Here, referring to FIG. 17A, it is assumed that the input buffer 107 operates normally (namely, that the input threshold voltage of the input buffer 107 is higher than the standardized voltage VstdL applied to the terminals 102 and 103). Since the output signal 114 of the input buffer 107 is brought to the low level in this situation, the output of the selector 607 is brought to the low level. Therefore, the NAND gate 609 supplies the high level signal to the gate input of the nMOS transistor Q$_{N19}$, so that this nMOS transistor is brought into the off condition. As a result, the charging path between the power supply terminal 30 and the monitor signal line 629 is cut off.

On the other hand, in order to change of the mode setting signal 51 to the high level, similarly to the V$_{IH}$ test, the precharge circuit 601 discharges the monitor signal line 629 to the low level (ground potential) during a period corresponding to the delay time of the delay element 613.

At this time, if all the input buffers under test pass the V$_{IL}$ test, the signal line 629 is discharged by the nMOS transistor Q$_{N20}$ to the low level, which is held by the pMOS transistor Q$_{P20}$ of the data hold circuit 604. This low level discrimination output signal is inverted by the inverter 631 to the high level, which is outputted through the output terminal 70 to the external circuit.

On the other hand, referring to FIG. 17B, when the input buffer fails the V$_{IL}$ test (namely, the threshold voltage of the input buffer 107 is lower than the standardized voltage VstdH of the low level input threshold voltage), the input buffer 107 outputs the high level signal 114. As mentioned hereinbefore, since the selector 607 selects the signal 114, the output signal of the selector 607 is brought to the high level. In response to the high level signal from the selector and the high level mode setting signal, the NAND gate 609 supplies the low level signal to the gate of the pMOS transistor Q$_{P19}$ so as to rum on the pMOS transistor Q$_{P19}$. As a result, the potential of the monitor signal line 629 becomes an intermediate potential between the power supply potential V$_{DD}$ and the ground potential. After the discharging made by the precharge circuit 601, the monitor signal line 629 is fully charged to the power supply potential V$_{DD}$, namely to the high level. This high level discrimination output signal is held in the data hold circuit 604, and inverted by the inverter 601 to the low level, which is outputted through the output terminal 70 to the external circuit. Thus, if at least one of all the input buffers fails the V$_{IL}$ test, the monitor signal line is not sufficiently discharged, and after the discharging period, the signal line is charged to the power supply potential, with the result that the low level discrimination output signal indicating "failure" is outputted to the external circuit.

Thus, in this embodiment, it is possible to directly and unambiguously discriminate to the effect that, if the data appearing on the output terminal 70 is at the high level, the test result is "pass" and if the data appearing on the output terminal 70 is at the low level, the test result is "failure".

As mentioned above, in accordance with the present invention, by connecting the output node of the logic gate receiving the output of the input buffer and the output of the logic gate for changing the testing condition, to the common signal line, it is possible to give a clear difference between the power supply current when the input buffer passes the input threshold voltage test and the power supply current when the input buffer fails the input threshold voltage test, and therefore, it is possible to certainly discriminate the "pass" and "failure" of the threshold voltage test. In addition, even if the LSI has a very large number of external input terminals (input buffers to be tested), if only one input buffer malfunctions, it is possible to immediately discriminate the failure. Therefore, it is possible to easily measure a real capability of the input buffer having the worst characteristics (distribution of the worst input threshold voltage in individual LSIs when a number of LSIs are measured).

In addition, according to the present invention, by constructing so that a given data is previously set onto the monitor signal line by the precharge circuit so that when at least one input buffer malfunctions, the data on the monitor signal line flips, it is possible to unambiguously discriminate the "pass" and "failure" on the basis of the output logic level of the discrimination result outputted to the external output terminal, regardless of the number of input buffers under test, and independently of whether the test is the $V_{IH}$ test or the $V_{IH}$ test.

According to the present invention, by causing the LSI tester to control the application of signals required to execute the test, to different input terminals (an input terminal of a circuit to be tested, and input terminals receiving a mode setting signal and a test condition setting signal), and to perform the "pass" and "failure", it is possible to make a test program and a test pattern to be used that is common to all products to which the present invention is applied. Therefore, it is possible to greatly reduce the number of steps for preparing the test program and the test pattern, so that the cost for manufacturing the LSI can be reduced.

In addition, in the prior art, the number of cycles of the test pattern depends upon the number of input terminals (the number of input buffers to be tested) and at least several hundred thousand cycles were required. In the present invention, on the other hand, the test can be completed with only two cycles, independently of the number of input terminals. Accordingly, it is possible to greatly reduce the test time. This is very effective in reducing the cost for manufacturing the LSI.

Furthermore, the LSI in accordance with the present invention can be constructed by small scale logic circuits which do not require a large driving power, and in addition, the signals outputted by the input buffers are coupled to one wiring conductor in the form of a wired OR. Therefore, the present invention never increases the number of the wiring conductors. Moreover, since it is possible to use an existing mode setting signal conventionally provided for the LSI testing, as a mode setting signal for indicating the execution of the test, the test can be executed without additionally providing the terminal for the input threshold test. In other words, the chip area, namely, the dimension of the chip is not enlarged, and therefore, the present invention is very effective for a high integration LSI.

I claim:

1. A digital semiconductor integrated circuit of the CMOS transistor structure having a plurality of input buffers, comprising:

a first logic gate provided for each of said input buffers, for outputting an output logic value determined by an output logic value of a corresponding input buffer, and a second logic gate for designating a logic value to be outputted from said first logic gate, in accordance with an output logic determined by an external control signal, an output node of said first and second logic gates being interconnected to the same signal line, so that when at least one of said plurality of input buffers outputs a logic signal different from a logic signal expected in response to an input signal applied from an external source and in accordance with said external control signal, the output logic values of said first and second logic gates become different from each other, whereby a signal collision occurs on said signal line, resulting in an increased power supply current.

2. A semiconductor integrated circuit claimed in claim 1 wherein said first logic gate is any one of a tristate buffer, a transfer gate, a clocked inverter, a NAND gate, a NOR gate, an AND gate and an OR gate.

3. A digital semiconductor integrated circuit of the CMOS transistor structure having a plurality of input buffers each receiving an external input signal to transfer the received signal to an internal circuit, comprising:

a first logic gate provided for each of said input buffers, for outputting an output logic value determined by an output logic value of a corresponding input buffer, and a second logic gate for generating an output logic value determined in accordance with an external control signal, an output node of said first and second logic gates being interconnected to a common signal line, so that when said first logic gate outputs a logic signal different from a logic signal outputted from said second logic gate determined in accordance with said external control signal, so that said output logic values of said first and second logic gates collide with each other on said common signal line, whereby a power supply current of the integrated circuit increases constantly, and activation/deactivation of the output of said first logic gates being controlled in bundle by a common control signal, wherein the same potential DC input signal is simultaneously applied to said plurality of input buffers, and said first logic gates are both put into an output activated condition, so that whether or not all of said input buffers output the logic level signal previously expected from said external control signal, is converted into a binary value on the basis of whether or not said power supply current increases constantly, thereby to enable discrimination of whether or not the input threshold voltage of all said input buffers exceeds the value determined by the potential of said potential DC input signal.

4. A digital semiconductor integrated circuit of the CMOS transistor structure having a plurality of input buffers, comprising:

a precharge circuit for previously charging or discharging a potential monitor signal line in accordance with an external control signal, and switches each on-off controlled by a logic value of an output signal of a corresponding input buffer, for discharging or charging said potential monitor signal line, so that whether or not said input buffer generates an output signal of a logic value expected on the basis of an external input signal given to the input buffer, is determined on the basis of whether said logic value flips on the previously charged or discharged potential monitor signal line, and occurrence/non-occurrence of the flip of the logic value is converted into a binary value, which is in turn outputted to the external output terminal.

5. A digital semiconductor integrated circuit of the CMOS transistor structure having a plurality of input buffers each receiving an external input signal to transfer the received signal to an internal circuit, comprising:

a monitor signal line the potential on which can be taken out to an external output terminal;

a precharge circuit for previously charging or discharging said monitor signal line in accordance with an external control signal for a predetermined period of time;

analog switches connected to said monitor signal line, each of said analog switches being provided for a corresponding one of said plurality of input buffers, so as to on-off control a current path between said monitor signal line and a fixed potential point in accordance with the logic value of the output signal of said corresponding input buffer, so that when at least one of said analog switches is turned on, a current of the charging or discharging of said monitor signal line by said precharging circuit flows into said fixed potential point, whereby after the charging or discharging of said predetermined period of time, the logic value of said monitor signal line when all said analog switches are off, is opposite to the logic value of said monitor signal line when at least one of said analog switches is on; and switch control circuits each provided between each of said input buffers and a corresponding one of said analog switches, for controlling a control terminal of said corresponding analog switch in accordance with the output signal of the corresponding input buffer, the activation and deactivation of the output of said switch control circuits being controlled in bundle by a common signal;

wherein the same level DC input signal is simultaneously applied to said plurality of input buffers, and said switch control circuits are put in bundle into an output activated condition, so that it is possible to discriminate whether or not the input threshold voltage of all said input buffers exceeds the value determined by the potential of said potential DC input signal, by converting whether or not all of said input buffers output the logic level signal previously expected from said DC input signal, is converted into a binary value indicative of whether or not the logic value of said monitor signal line flips.

6. A semiconductor integrated circuit claimed in claim 5 further including means for holding, on said monitor signal line, the discrimination data determined by the signal logic value appearing on said monitor signal line.

7. A semiconductor integrated circuit of the CMOS transistor structure comprising:

a plurality of input circuits each including an input buffer receiving an external input signal to transfer the received input signal to an internal circuit, a first two-input NOR gate having one input receiving an output signal of said input buffer, a first MOS transistor of the n-channel type having its gate receiving an output of said first NOR gate, its source connected to ground, and its drain connected to a monitor signal line, a second two-input NOR gate having one input receiving an inverted signal of said output signal of said input buffer, a second MOS transistor of the n-channel type having its gate receiving an output of said second NOR gate, its source connected to said ground, and its drain connected to said monitor signal line;

a precharge circuit including a first two-input NAND gate having its one input receiving a first control signal from an external and its other input receiving a delay signal of an inverted signal of said first control signal, and a third MOS transistor of the p-channel type having its gate receiving an output of said first NAND gate, its source connected to a high voltage line and its drain connected to said monitor signal line;

an output buffer for amplifying a signal appearing on said monitor signal line to output the amplified signal to an external;

a data hold circuit composed of a first inverter having an input connected to said monitor signal line and a second inverter having an output connected to said monitor signal line and an input connected to an output of said first inverter; and a control circuit including a second two-input NAND gate receiving said first control signal and a second control signal supplied from an external source, and a third two-input NAND gate receiving an inverted signal of said second control signal and said first control signal, an output signal of said second NAND gate being supplied to the other input of said first NOR gate of each input circuit, and an output signal of said third NAND gate being supplied to the other input of said second NOR gate of each input circuit, and an output signal of said output buffer being outputted to the external.

8. A semiconductor integrated circuit of the CMOS transistor structure comprising:

a plurality of input circuits each including an input buffer receiving an external input signal to transfer the received input signal to an internal circuit, a selector selecting either an output signal of said input buffer or an inverted signal of said output signal in accordance with a logic level of a given selection signal, a two-input NAND gate receiving an output signal of said selector and a first control signal supplied from an external, and a first MOS transistor of the p-channel type having its gate receiving an output of said NAND gate, its source connected to a high voltage line, and its drain connected to a monitor signal line;

a precharge circuit including a two-input NOR gate receiving an inverted signal and a non-inverted delayed signal of said first control signal, and a second MOS transistor of the n-channel type having its gate receiving an output of said NOR gate, its source connected to a ground line and its drain connected to said monitor signal line;

an inverting output buffer for amplifying and inverting a signal appearing on said monitor signal line to output the amplified and inverted signal to an external output terminal;

a data hold circuit composed of a third MOS transistor of the p-channel connected to form a current path between said monitor signal line and said high voltage line, and having its gate connected to receive an output signal of said inverting output buffer;

a control circuit composed of a two-input AND gate receiving said first control signal and a second control signal applied from the external source;

an output of said AND gate of said control circuit being supplied to said selector as said selection signal, and an output signal of said output buffer being outputted to the external.

* * * * *